United States Patent [19]

Itakura

[11] Patent Number: 5,608,352
[45] Date of Patent: Mar. 4, 1997

[54] DIFFERENTIAL INPUT CIRCUIT CAPABLE OF BROADENING OPERATION RANGE OF INPUT COMMON MODE POTENTIAL

[75] Inventor: Tetsuro Itakura, Tokyo-to, Japan

[73] Assignee: Kabushiki Kaisha Toshiba, Kawasaki, Japan

[21] Appl. No.: 362,268

[22] Filed: Dec. 22, 1994

[30] Foreign Application Priority Data

Dec. 22, 1993 [JP] Japan ................................. 5-325233

[51] Int. Cl.⁶ ................................. H03F 3/45; H03F 3/68
[52] U.S. Cl. ........................ 330/253; 330/252; 330/295
[58] Field of Search ................................. 330/252, 253, 330/255, 258, 295, 311

[56] References Cited

U.S. PATENT DOCUMENTS 4,977,378 12/1990 Tero ..................................... 330/252 X

FOREIGN PATENT DOCUMENTS 63-67905 3/1988 Japan .

Primary Examiner—James B. Mullins
Attorney, Agent, or Firm—Foley & Lardner

[57] ABSTRACT

A differential input circuit includes a first differential pair having first and second transistors for receiving a differential input signal, and for transmitting a differential output signal. A second differential pair includes third and fourth transistors commonly connected to an output of the first differential pair. A differential amplifier circuit includes a third differential pair having fifth and sixth transistors for inputting the differential input signal commonly with the first differential pair for generating a differential amplify signal which is supplied to the second differential pair; so that the potential of an output operating point is set to operate the third and fourth transistors of the second differential pair.

19 Claims, 25 Drawing Sheets

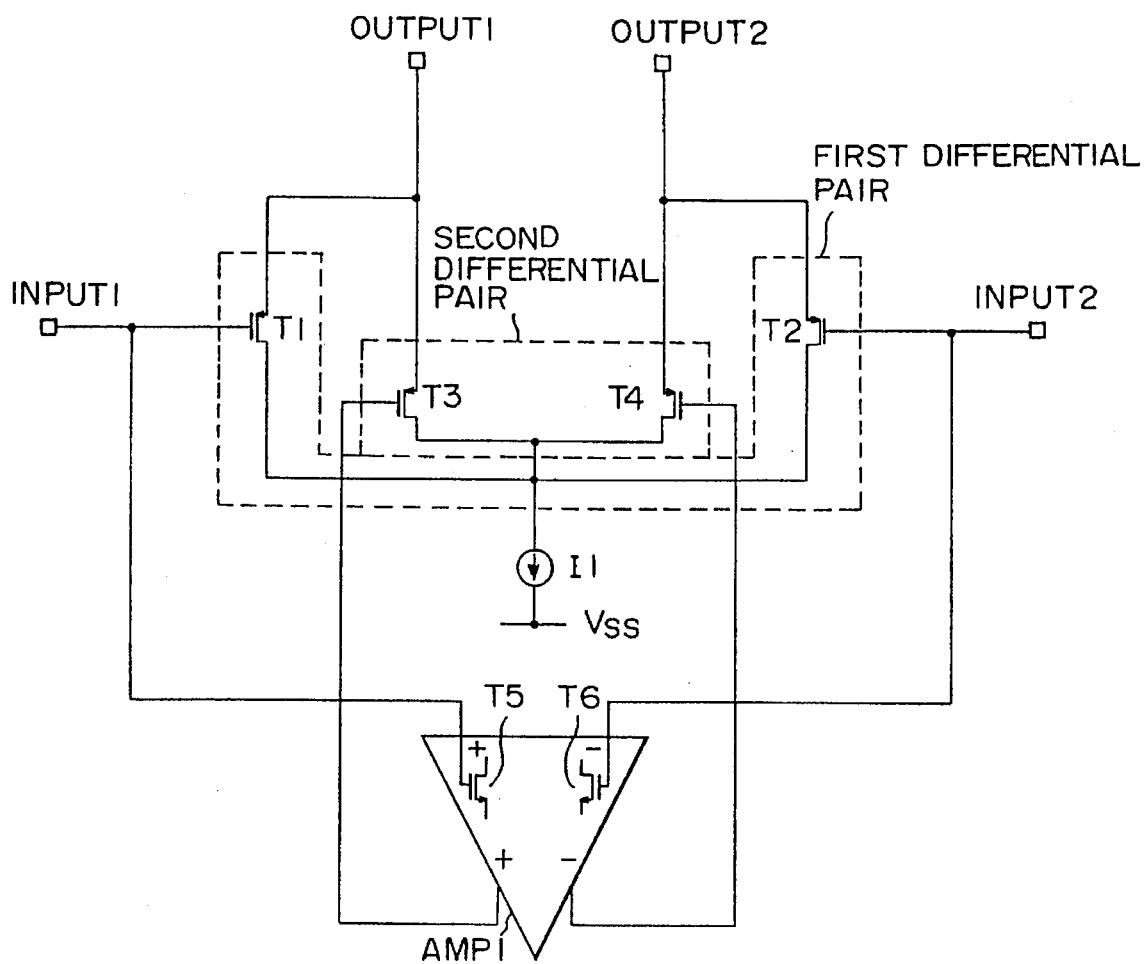
FIG. IB

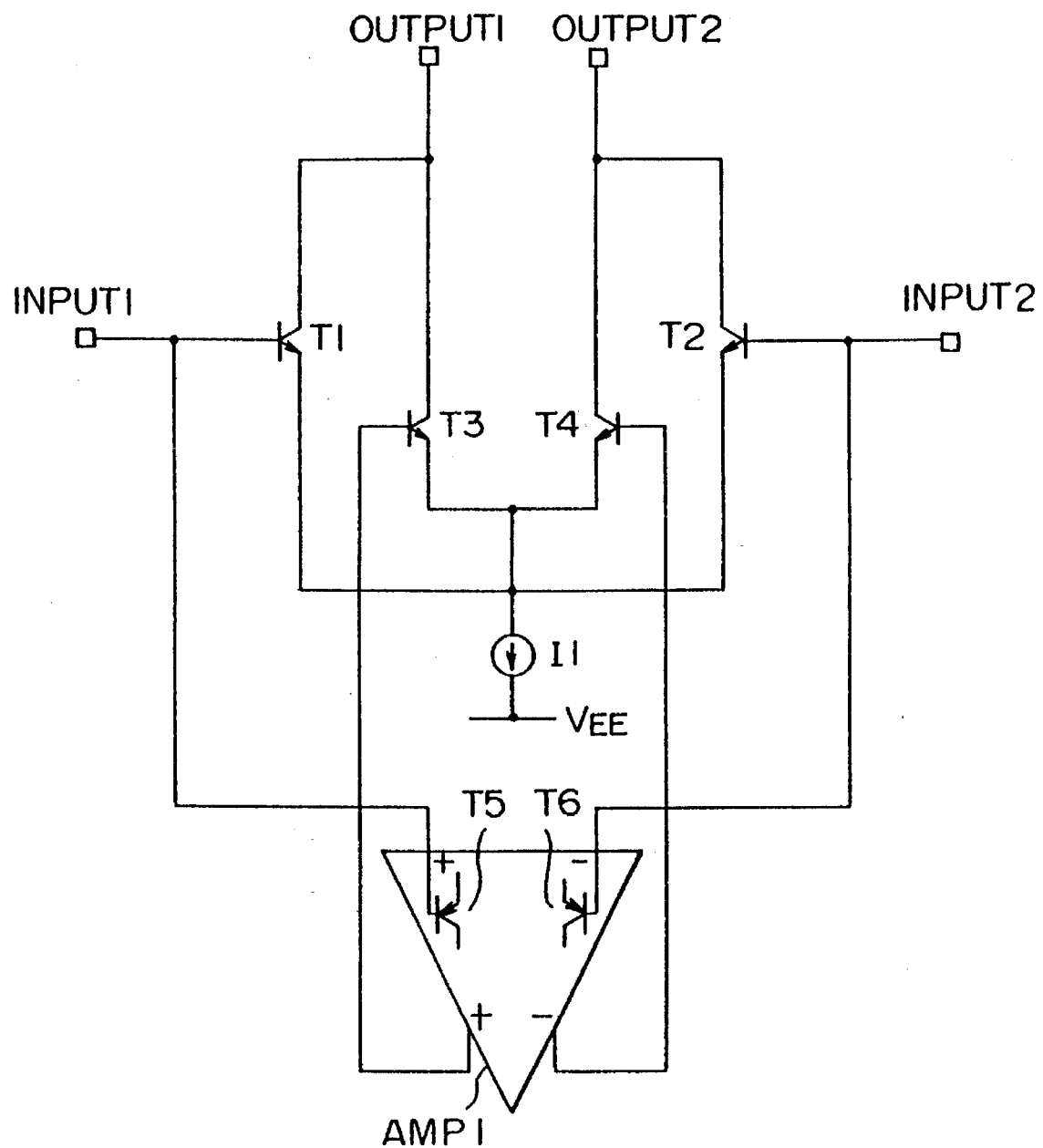
F I G. 2A

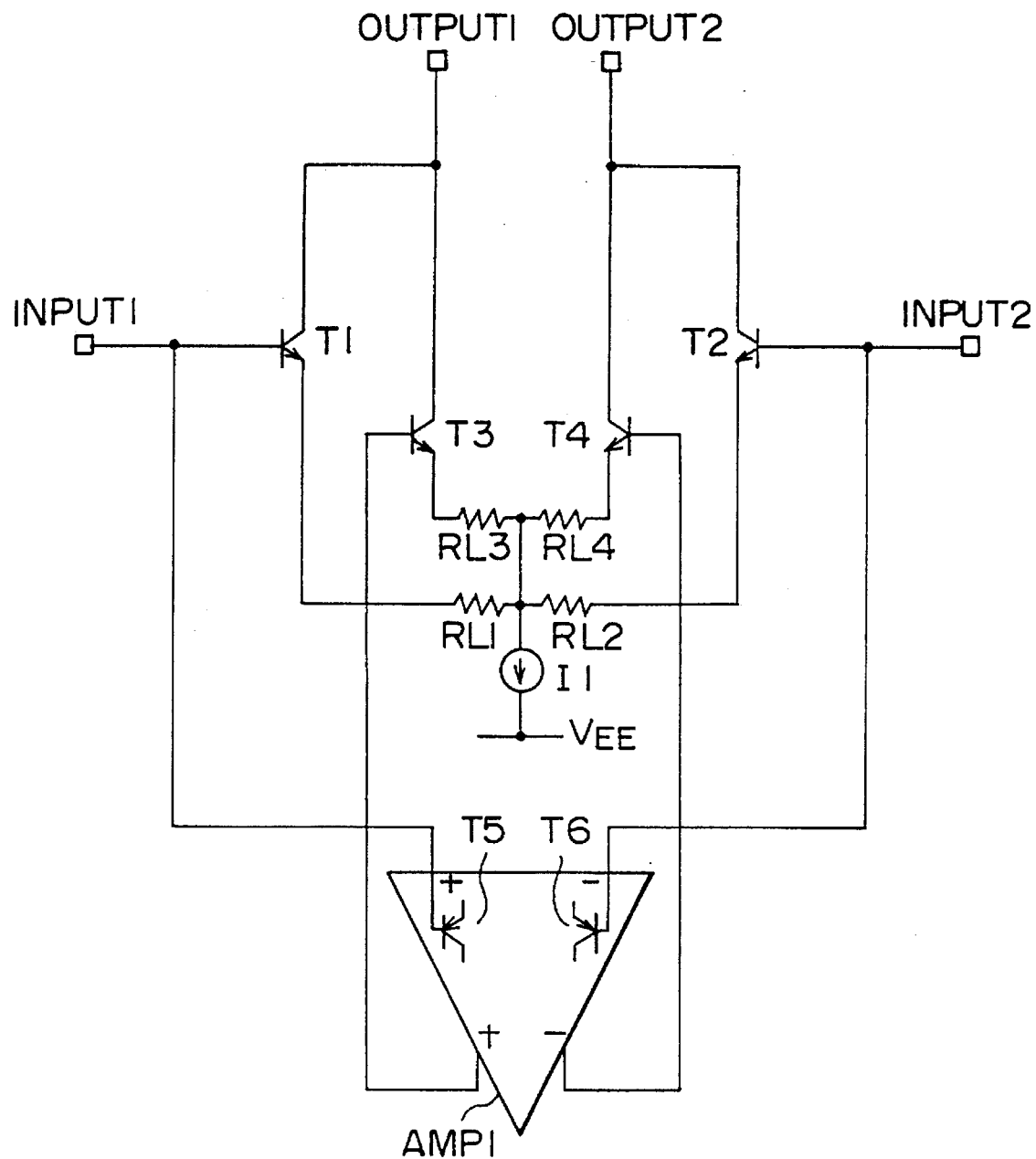
F I G. 3

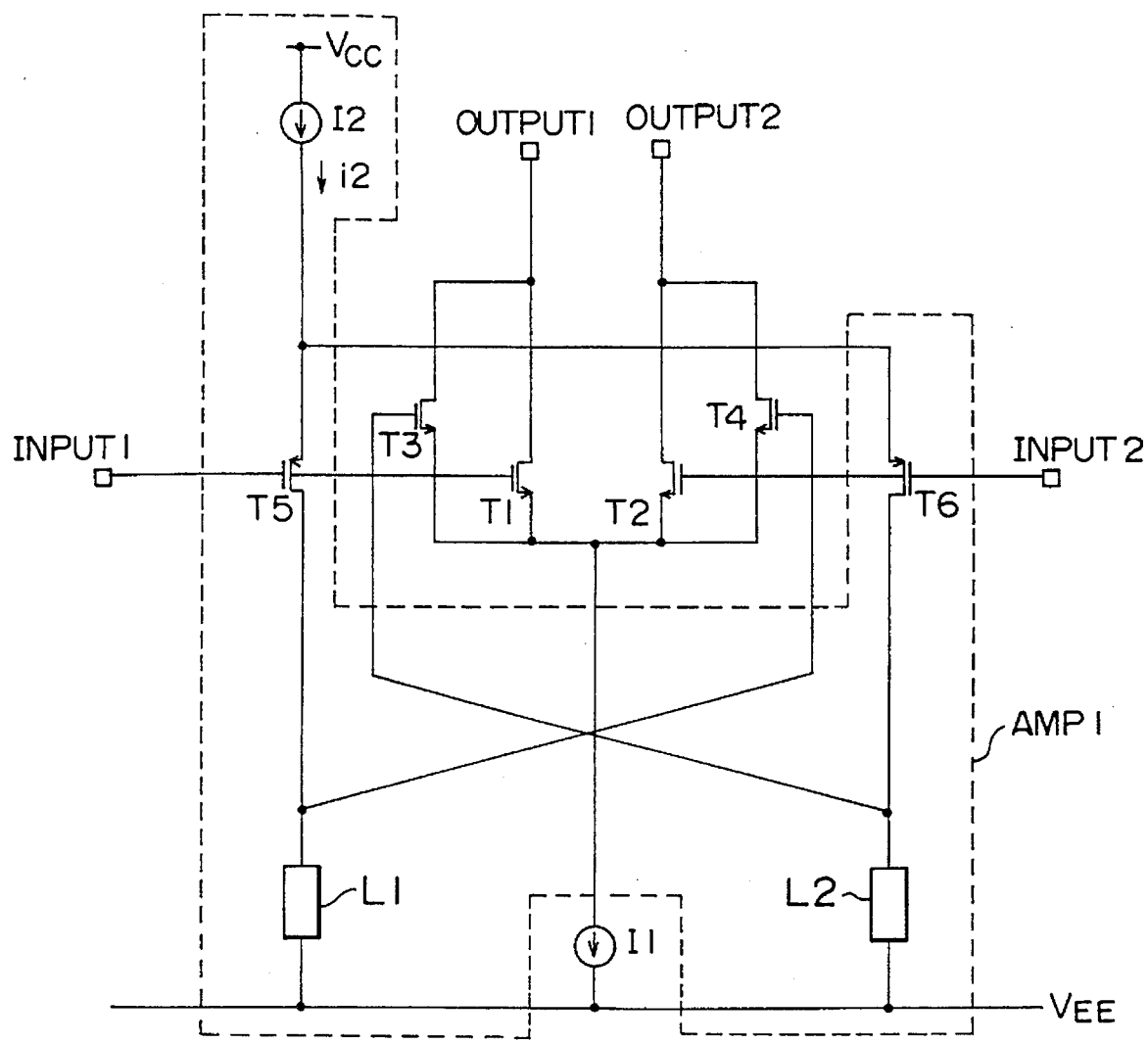
F I G. 6

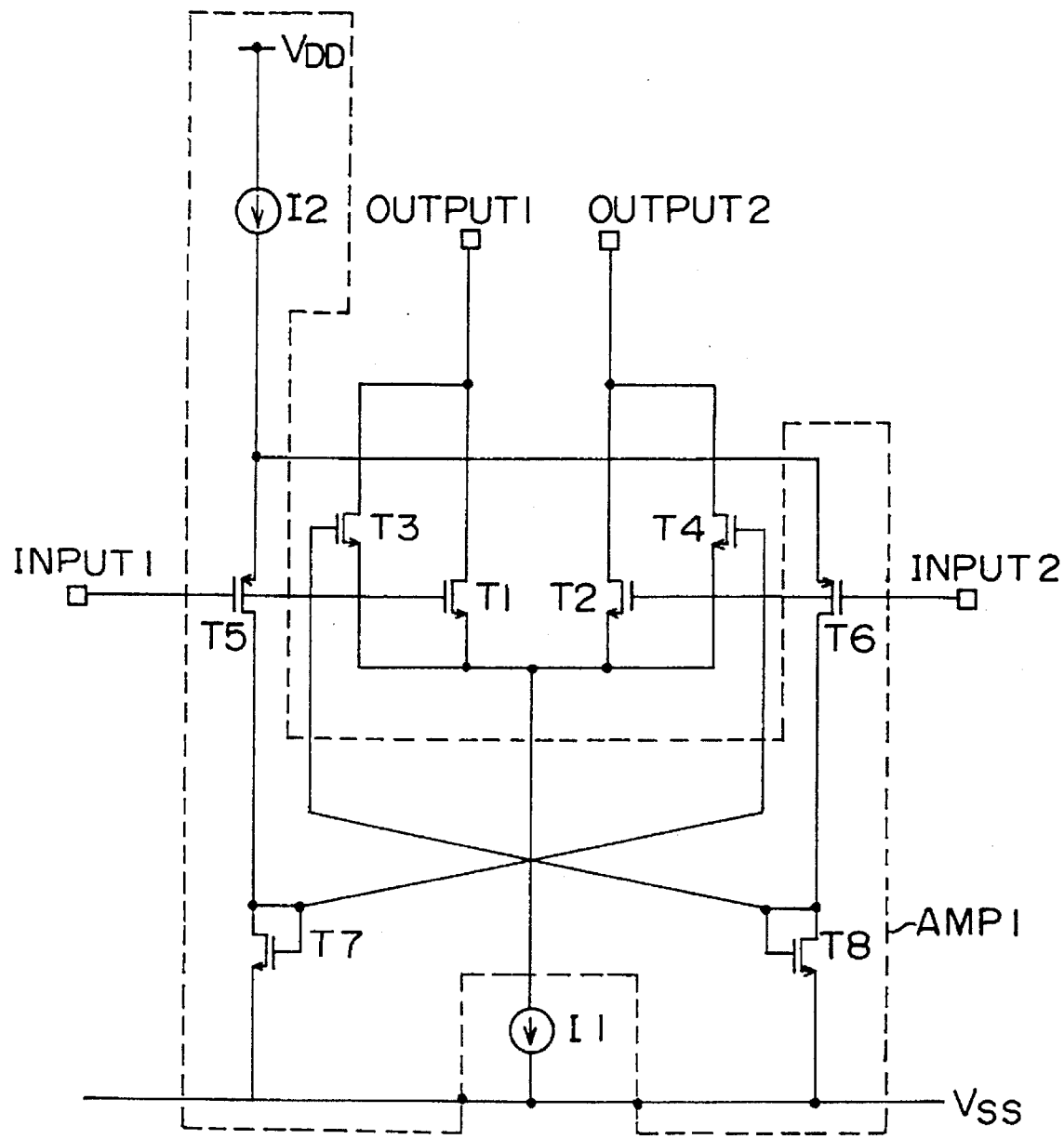
F I G. 8

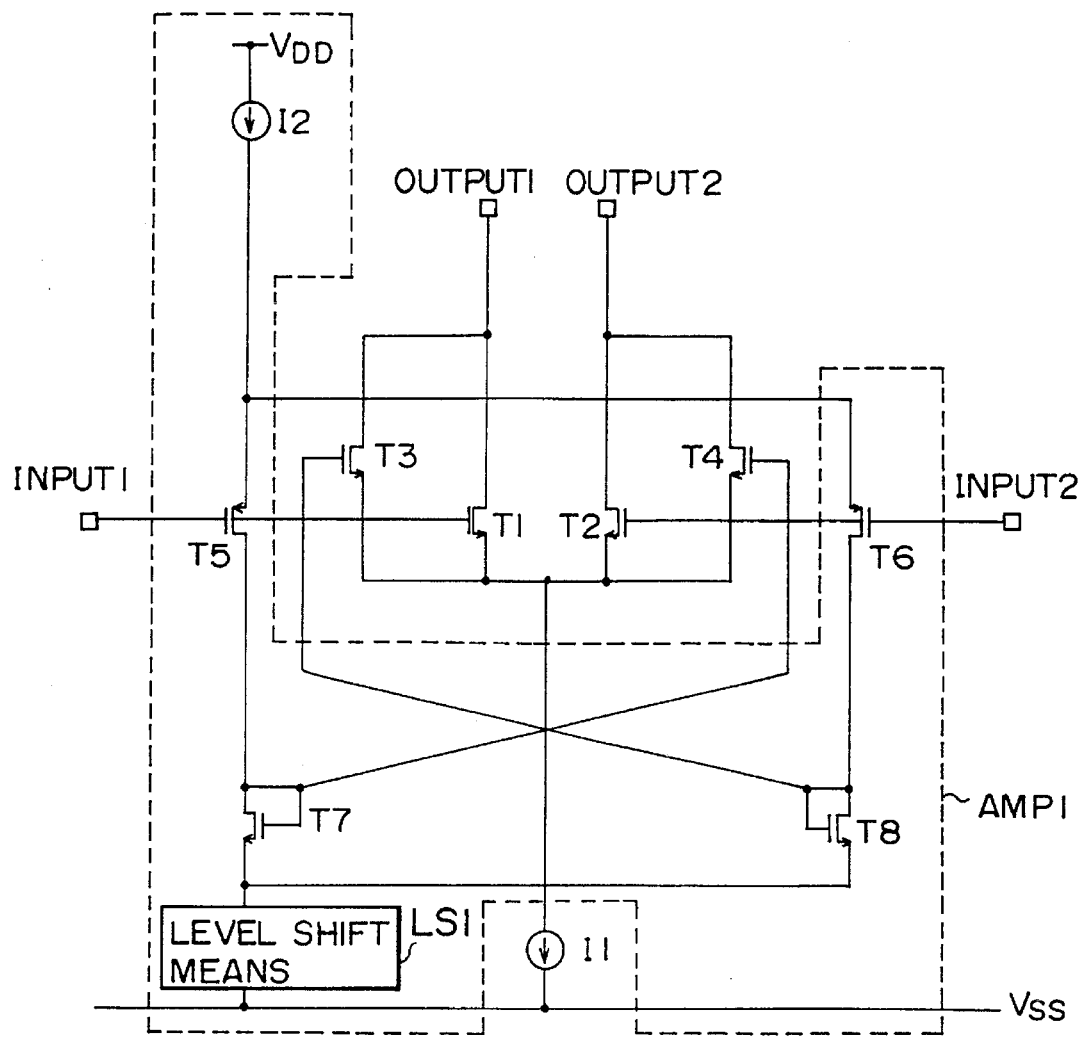
F I G. 9

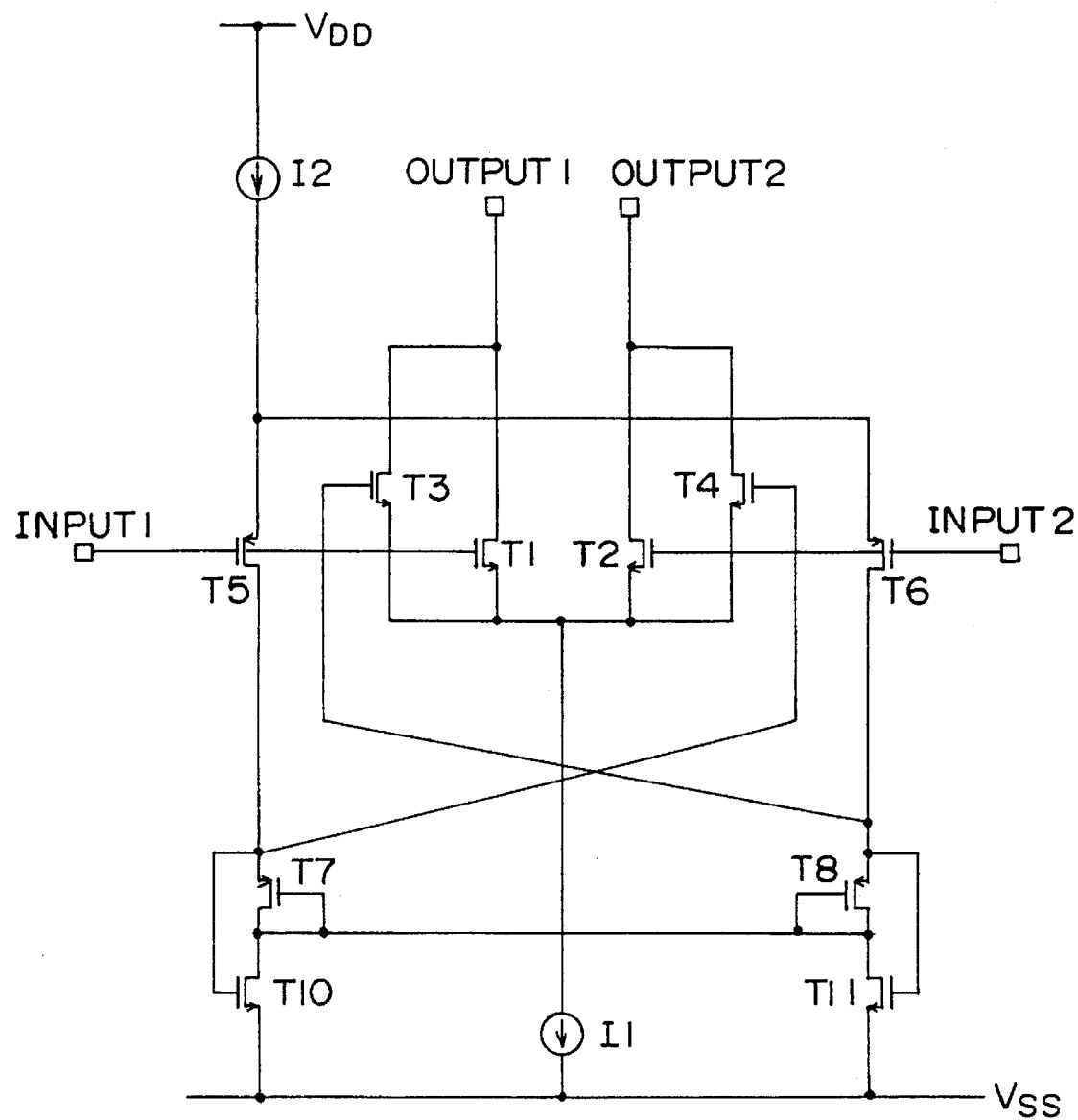
F I G. 12

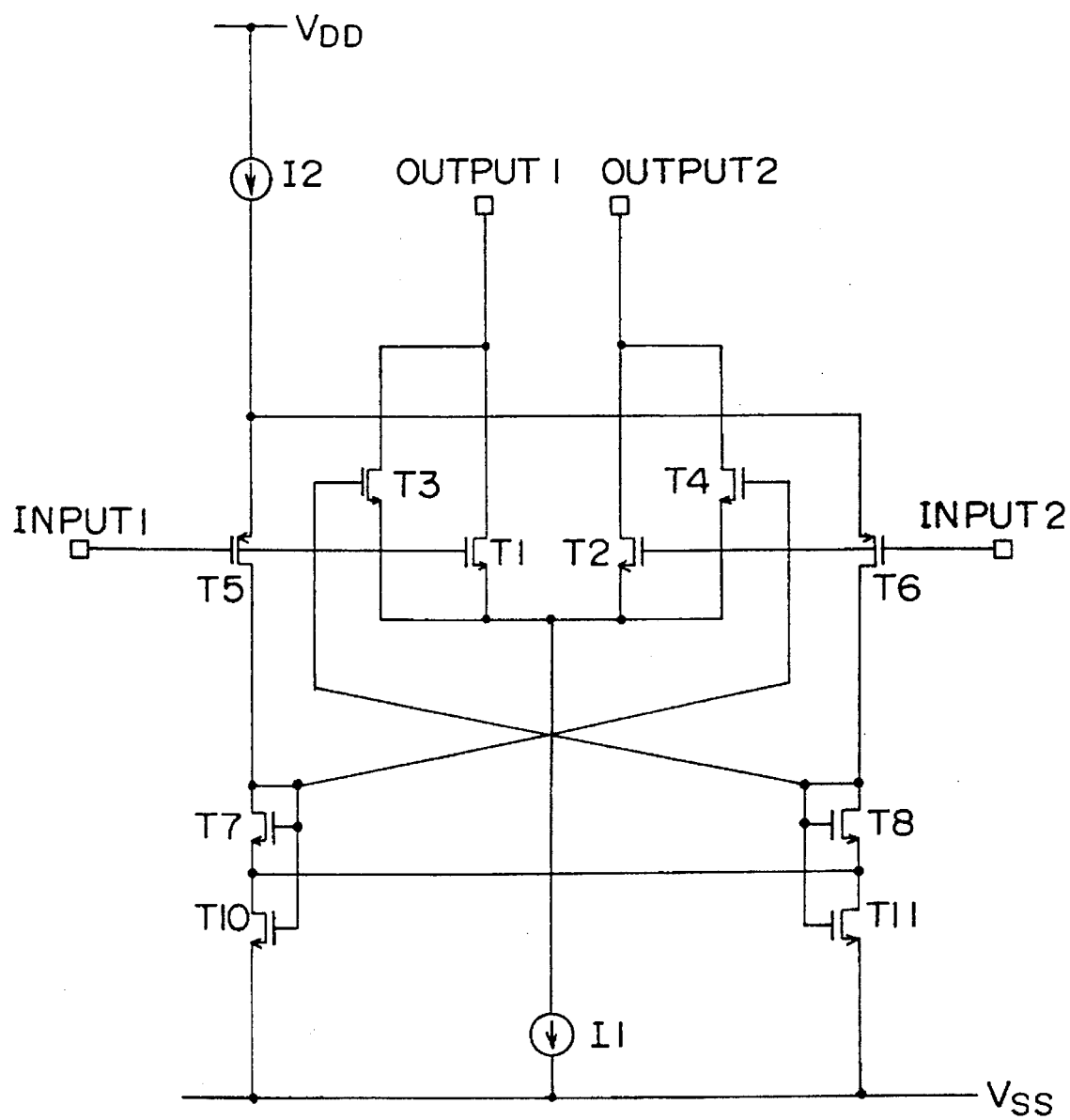
F I G. 13

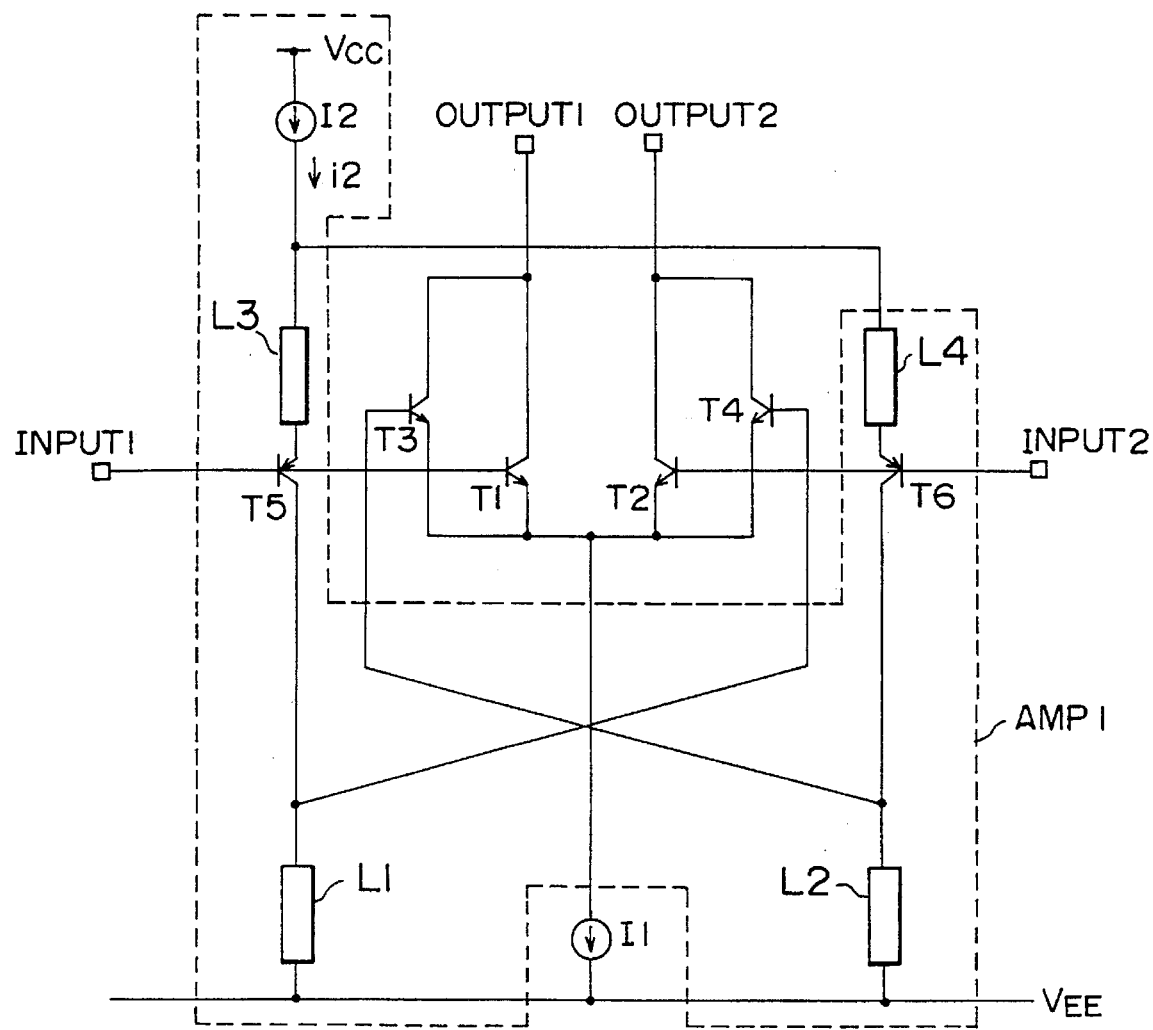
F I G. 14

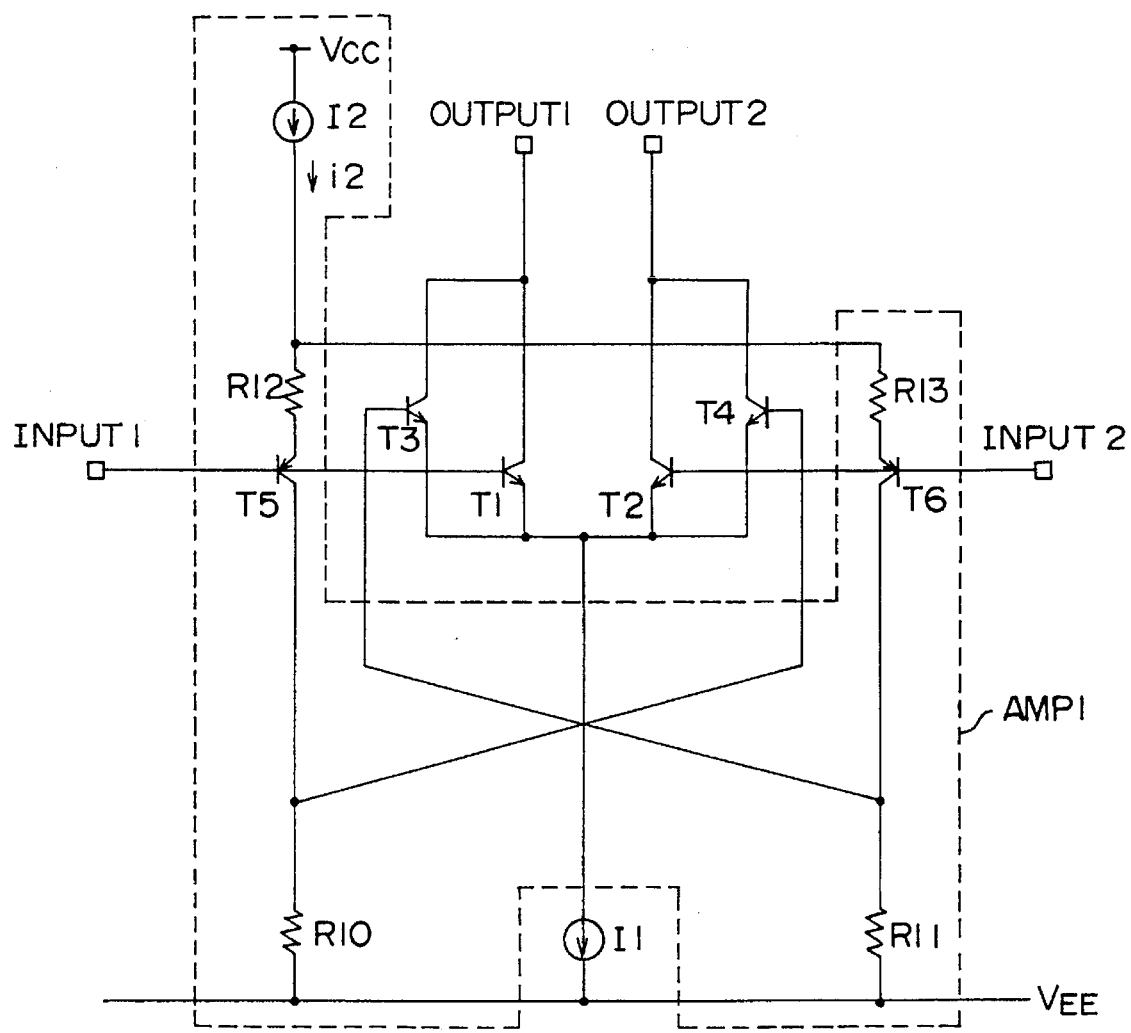
F I G. 15

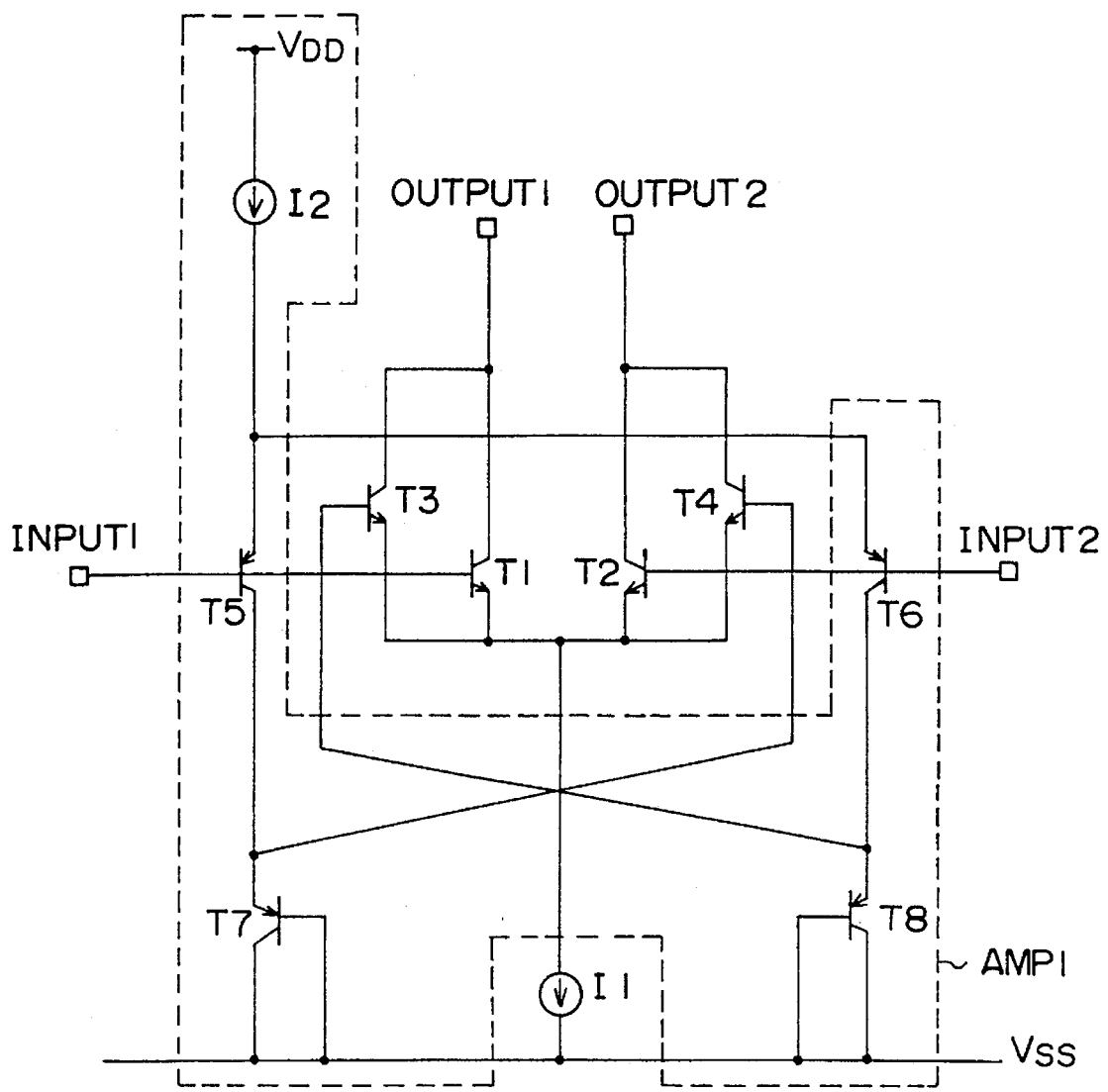
F I G. 16

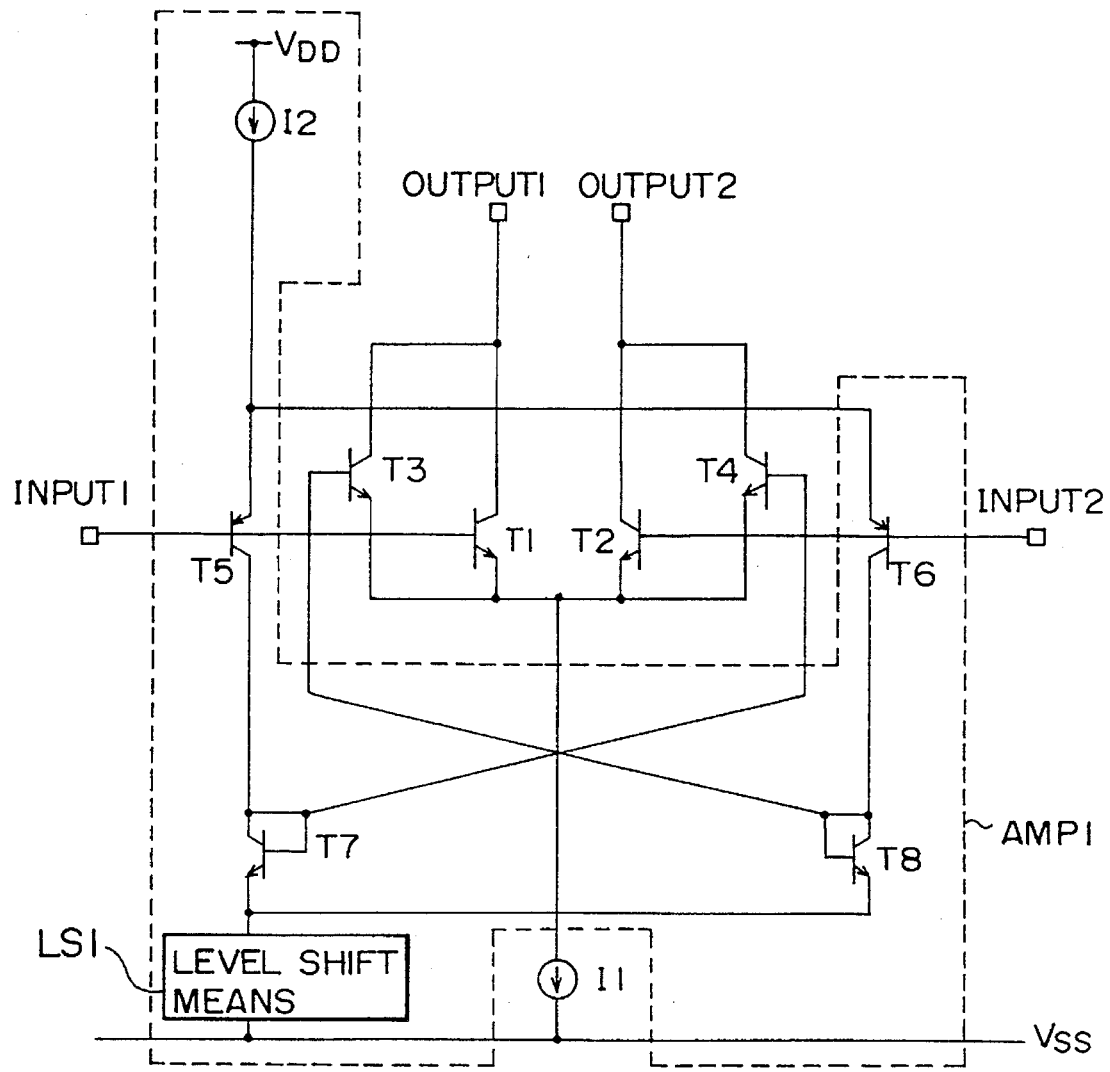
F I G. 18

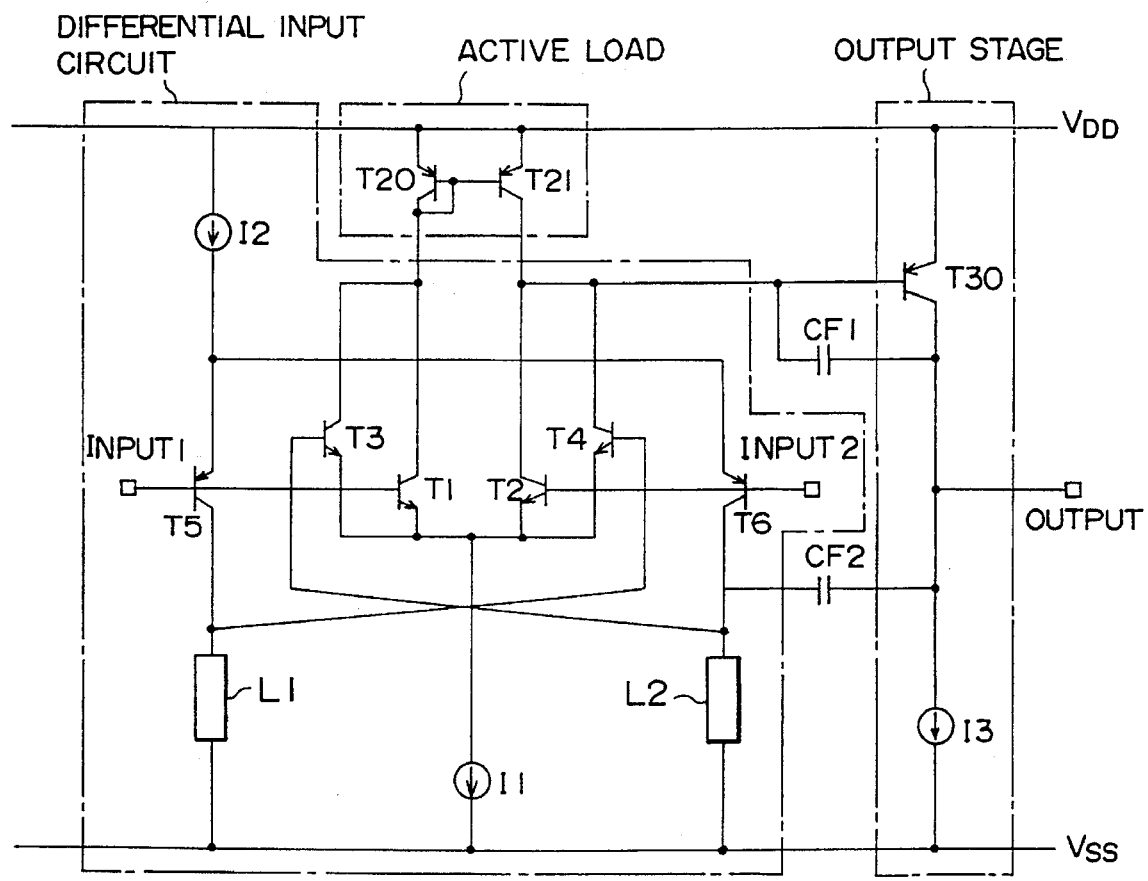
F I G. 22

1

DIFFERENTIAL INPUT CIRCUIT CAPABLE OF BROADENING OPERATION RANGE OF INPUT COMMON MODE POTENTIAL

BACKGROUND OF THE INVENTION

The present invention relates to a differential input circuit, and more specifically to the technology for broadening a common mode operation range of a differential input signal.

The differential input circuit having a differential signal as an input, can be conventionally realized by differential pairs using field effect transistors (FET) and bipolar transistors. The conventional differential input circuit has a limitation in the input common mode operational range of the differential input signal because of a gate and source voltage $V_{gs}$ of the FET and a base and emitter voltage $V_{be}$ of the bipolar transistor both constituting the differential pair.

Accordingly, in order to improve the limitation, there is provided a method for broadening an operational range of a common mode potential in an input differential signal by means of a current addition between outputs of two pairs of differential pairs having different conductive types, as disclosed in Pardoen, "A Rail-to-Rail Input/ Output CMOS Power Amplifier", IEEE JSSC Vol. 25 No. 2 pp. 501–504 (see FIG. 1 of the IEEE document).

However, in this method, since there is a case in which where one of the differential pairs directly operates and the other of the differential pairs performs practically no operation, and a case where both of the differential pairs simultaneously operate because of the largeness of an input common mode potential, there is a problem that a sum of the output currents obtained by the differential is uneven in accordance with an operating point of an input common mode potential caused by a matching error of the current source in each of the differential pairs. Therefore, when the differential amplifier circuit is used in a circuit having a resistance load, an output operating point becomes uneven.

As described above, in the conventionally used differential input circuit, the sum of the output currents for obtaining the differential signal is uneven depending on the common mode input operating point, thereby resulting a problem that a stable output cannot be obtained.

SUMMARY OF THE INVENTION

In view of the above-mentioned condition, an object of the present invention is to provide a differential input circuit in which a sum of the output currents obtained by the differential does not depend on a common mode input operating point.

In order to achieve the above object, a differential input circuit according to the present invention has a characteristic of comprising a first differential pair consisting first and second transistors, a second differential pair consisting third and fourth transistors both having the same conductive type as the first and second transistors constructing the first differential pair, input means for supplying a differential signal to the first differential pair, output means for outputting an added differential signal generated by adding the differential signals each outputted from the first and second differential pairs, and bias means for supplying a bias current to the first and second differential pairs; the differential input circuit further comprises a differential amplifier circuit including a third differential pair comprised of fifth and sixth transistors each having another conductive type opposite to the first and second transistors constructing the first differential pair, for receiving the differential input signal supplied to the first differential pair and for generating a differential signal to supply the second differential pair.

In another aspect of the present invention, the differential input circuit comprises the first differential pair consisting of the first and second transistors receiving the differential input signal, the second differential pair consisting the third and fourth transistors formed by a semiconductor of the same conductive type as the first and second transistors and having an output commonly connected with the output of the first differential pair, first current source means for commonly supplying a current to the first and second differential pairs, a first differential amplifier receiving the differential input signal as the same manner of the first differential pair, wherein an input portion of the first differential amplifier circuit is comprised of the fifth and sixth transistors having another conductive type of the transistors constructing the second differential pair, and an output of the first differential amplifier circuit is connected to an input of the second differential pair, thereby setting a potential of an output operating point to operate the first and second transistors.

In accordance with the above configuration, when the transistors constructing the first and second differential pairs are formed by a semiconductor of an N-channel or npn, the first differential pair having the first and second transistors operates as the differential input circuit in the case where the fifth and sixth transistors are turned off when the common mode potential $V_c$ of the differential input signal is more than the threshold voltage of the N-channel transistor.

Furthermore, when the common mode potential $V_c$ of the differential input signal is more than the threshold voltage of the N-channel transistor and is within a potential range in which the fifth and sixth transistors operate, an operating point of an output of the first differential amplifier circuit is selected to be over the threshold voltage to operate the first and second transistors, thereby operating at least any of the first and second differential pairs as the differential input circuit.

Moreover, when the common mode voltage $V_c$ of the differential input signal is less than the threshold voltage of the N-channel transistor, the first and second transistors are turned off. However, since an input portion of the first differential amplifier circuit receiving the differential input signal is constructed from a P-channel transistors, the transistors in the first differential amplifier circuit can operate without turning off. Furthermore, since the operating point of the output of the first differential amplifier circuit is set to be more than the threshold voltage in order to cause the third and fourth transistors to be operated, the second differential pair consisting the third and fourth transistors can operate as the differential input circuit.

In this manner, since any of the first and second differential pairs operates as the differential input circuit despite of the common mode potential $V_c$ of the differential input signal, since sources or emitters in the first and second differential pairs are commonly connected with one another to input the current of the current source, and since the differential outputs of the first and second differential pairs are connected commonly with each other, the total sum of the differential output currents of the differential input circuit according to the present invention is constant and even in spite of the change of the common mode potential $V_c$ of the differential input signal.

As described above, any differential pair of the first and second differential pairs ordinarily operates as the differential input circuit despite of the common mode potential of the differential input signal. Furthermore, there are commonly connected emitter or source terminals of the first and second differential pairs with one another. Still furthermore, the differential outputs of the first and second differential pairs are commonly connected with each other. Accordingly, the sum of the differential output currents of the differential pairs is constant even despite of the common mode potential $V_c$ of the differential input signal.

BRIEF DESCRIPTION OF THE DRAWINGS

In the accompanying drawings:

FIGS. 1(A) and 1(B) are circuit diagrams showing a differential input circuit according to a first embodiment of the present invention;

FIGS. 2(A) and 2(B) are circuit diagrams showing a differential input circuit according to a second embodiment of the present invention;;

FIG. 3 is a circuit diagram showing a differential input circuit according to a third embodiment of the present invention;

FIG. 6 is a circuit diagram showing a differential input circuit according to a sixth embodiment of the present invention;

FIG. 8 is a circuit diagram showing a differential input circuit according to an eighth embodiment of the present invention;

FIG. 9 is a circuit diagram showing a differential input circuit according to a ninth embodiment of the present invention;

FIG. 12 is a circuit diagram showing a differential input circuit according to a twelfth embodiment of the present invention;

FIG. 13 is a circuit diagram showing a differential input circuit according to a thirteenth embodiment of the present invention;

FIG. 14 is a circuit diagram showing a differential input circuit according to a fourteenth embodiment of the present invention;

FIG. 15 is a circuit diagram showing a differential input circuit according to a fifteenth embodiment of the present invention;

FIG. 16 is a circuit diagram showing a differential input circuit according to a sixteenth embodiment of the present invention;

FIG. 18 is a circuit diagram showing a differential input circuit according to an eighteenth embodiment of the present invention;

FIG. 22 is a circuit diagram showing a differential input circuit according to a twenty-second embodiment of the present invention.

DETAILED DESCRIPTION OF THE PREFERRED EMBODIMENTS

There will be described in detail a differential input circuit according to preferred embodiments of the present invention in reference with the attached drawings.

Figure 1A:
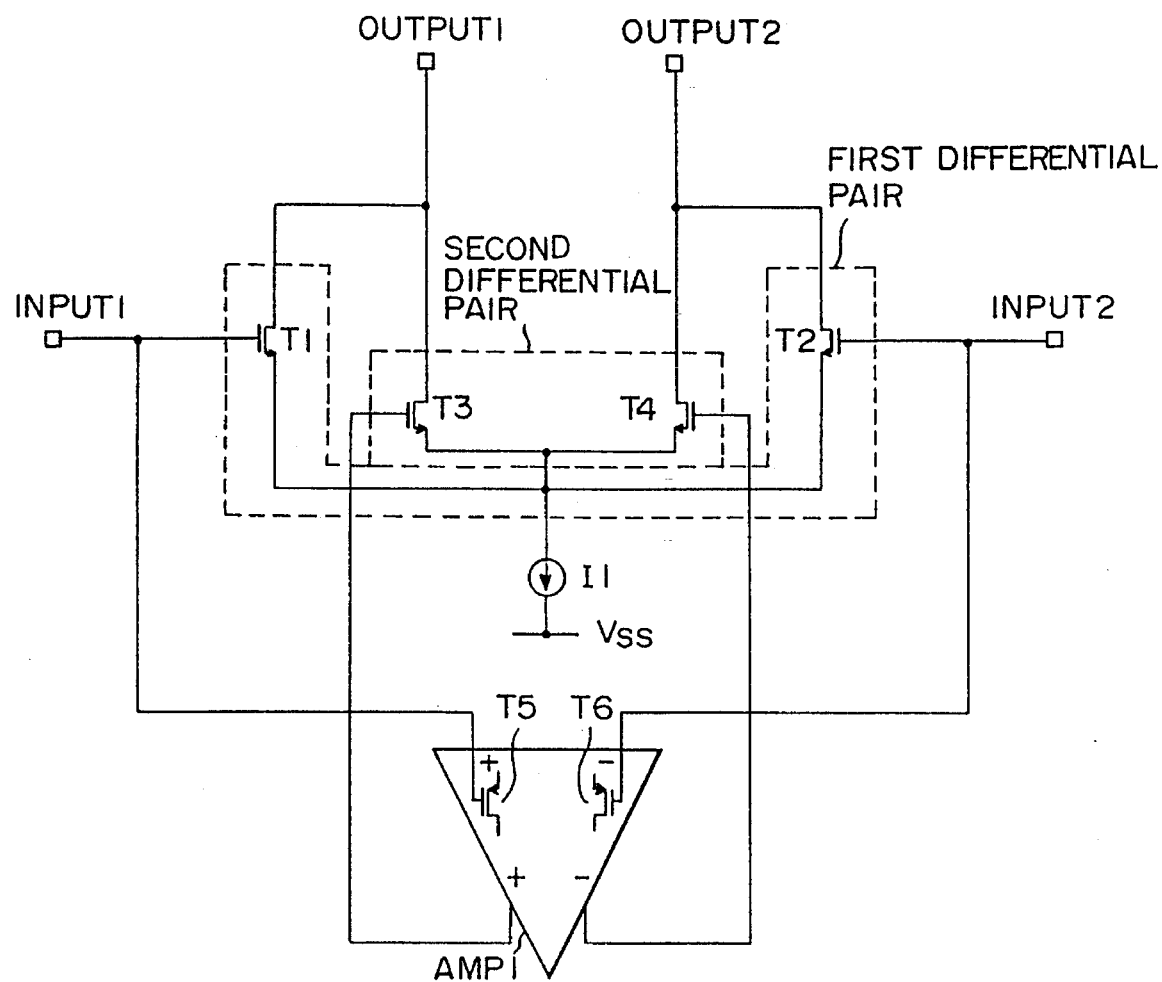

FIGS. 1(A) and 1(B) shows a differential input circuits according to a first embodiment of the present invention.

As shown in FIG. 1(A), a current source $I_1$ is connected to a power source $V_{SS}$, and has an output end which is connected to a common source of a first differential pair and a common source of a second differential pair, respectively. The first differential pair comprises first and second N-channel metal oxide semiconductor field effect transistors (N-MOS FET) T1 and T2. The second differential pair comprises third and fourth N-MOS FET T3 and T4. Differential outputs of the first and second differential pairs are interconnected. Accordingly, drains of the N-MOS FET T1 and T3 are commonly connected, and drains of the N-MOS FET T2 and T4 are also commonly connected. A differential input signal is supplied to gates of the N-MOS FET T1 and T2 as an input portion of the first differential pair, and at the same time, is also supplied to gates of P-channel MOS (P-MOS) FET T5 and T6 constituting an input portion of a differential amplifier circuit AMP1. The differential amplifier circuit AMP1 supplies a differential output to gates of the N-MOS FET T3 and T4 constituting the second differential pair. Here, a potential of an operating point of the differential output from the differential amplifier circuit AMP1 is selected to become over a threshold voltage of the N-MOS FET T3 and T4.

According to such the configuration, when a common mode potential $V_c$ of the differential input signal is more than the threshold voltage of the N-MOS FET and when the P-MOS FET as the input portion of the differential amplifier is turned off, the first differential pair including the N-MOS FET T1 and T2 operates as the differential input circuit. Furthermore, when the common mode potential $V_c$ of the differential input signal is more than the threshold voltage of the N-MOS FET and is within a potential range capable of operating the P-MOS FET, since the operating point of the output of the differential amplifier circuit AMP1 is selected to be over the threshold voltage of the N-MOS FET T3 and T4, at least one differential pair in the first and second differential pairs operates as the differential input circuit. Still furthermore, when the common mode potential $V_c$ is less than the threshold voltage of the N-MOS FET, even though the N-MOS FET T1 and T2 are turned off, since the input portion of the differential amplifier circuit AMP1 receiving the input signal is constituted by the P-MOS FET to be turned on and an operating point of the differential amplifier circuit AMP1 is selected to be over the threshold voltage of the N-MOS FET T3 and T4, the differential pair including the N-MOS FET T3 and T4 operates as the differential input circuit.

As described above, at least one differential pair in the first and second differential pairs operates as the differential input circuit in spite of the common mode potential of the differential input signal, the source terminals of the first and second differential for receiving a current are interconnected, and the differential outputs of the first and second differential pairs are commonly connected with each other, thereby causing a sum of the differential current of the differential circuit according to the first embodiment of the present invention to be constant and even despite of the common mode potential $V_c$ of the differential input signal.

Figure 2B:
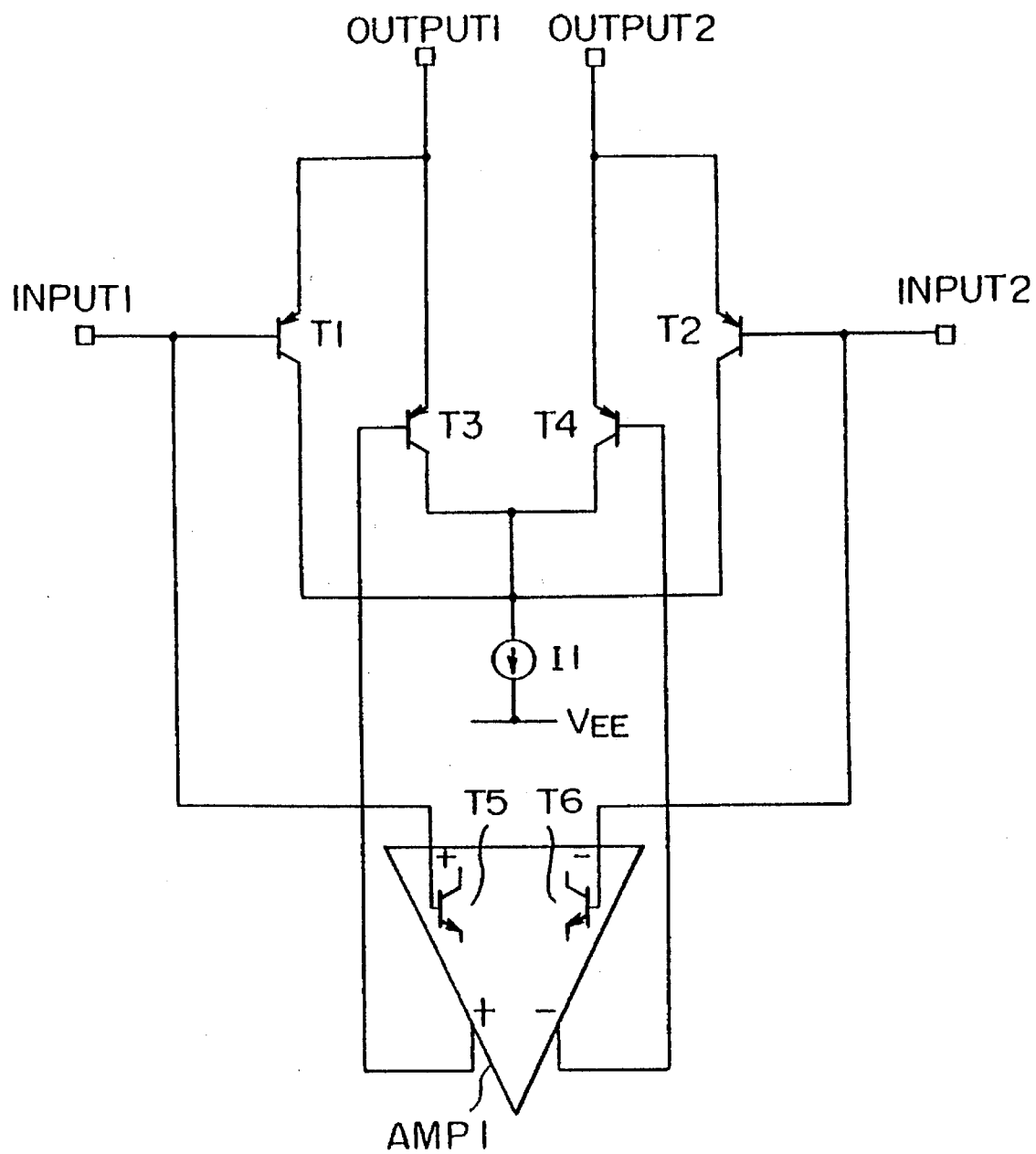

In FIG. 1(B), T1, T2, T3, and T4 are P-MOS FETs, and T5 and T6 are N-MOS FETs. Even though there has been described the differential input circuit according to the first embodiment as shown in FIGS. 1(A) and 1(B) in which both of the first and second differential pairs are formed by a metal oxide layer field effect transistor (MOS FET), the present invention is not limited in this and the first and second differential pairs may be constituted from bipolar transistors. For example, in a second embodiment shown in FIGS. 2(A) and 2(B), each of elements constituting a differential input circuit is formed by the bipolar transistor.

Also, in a third embodiment as shown in FIG. 3, a transistor of a circuit is constructed from a bipolar transistor and resistors RL1–RL4 may be provided for an emitter degeneration between emitters of the first and second differential pairs in order to broaden a linear input range.

Figure 4:
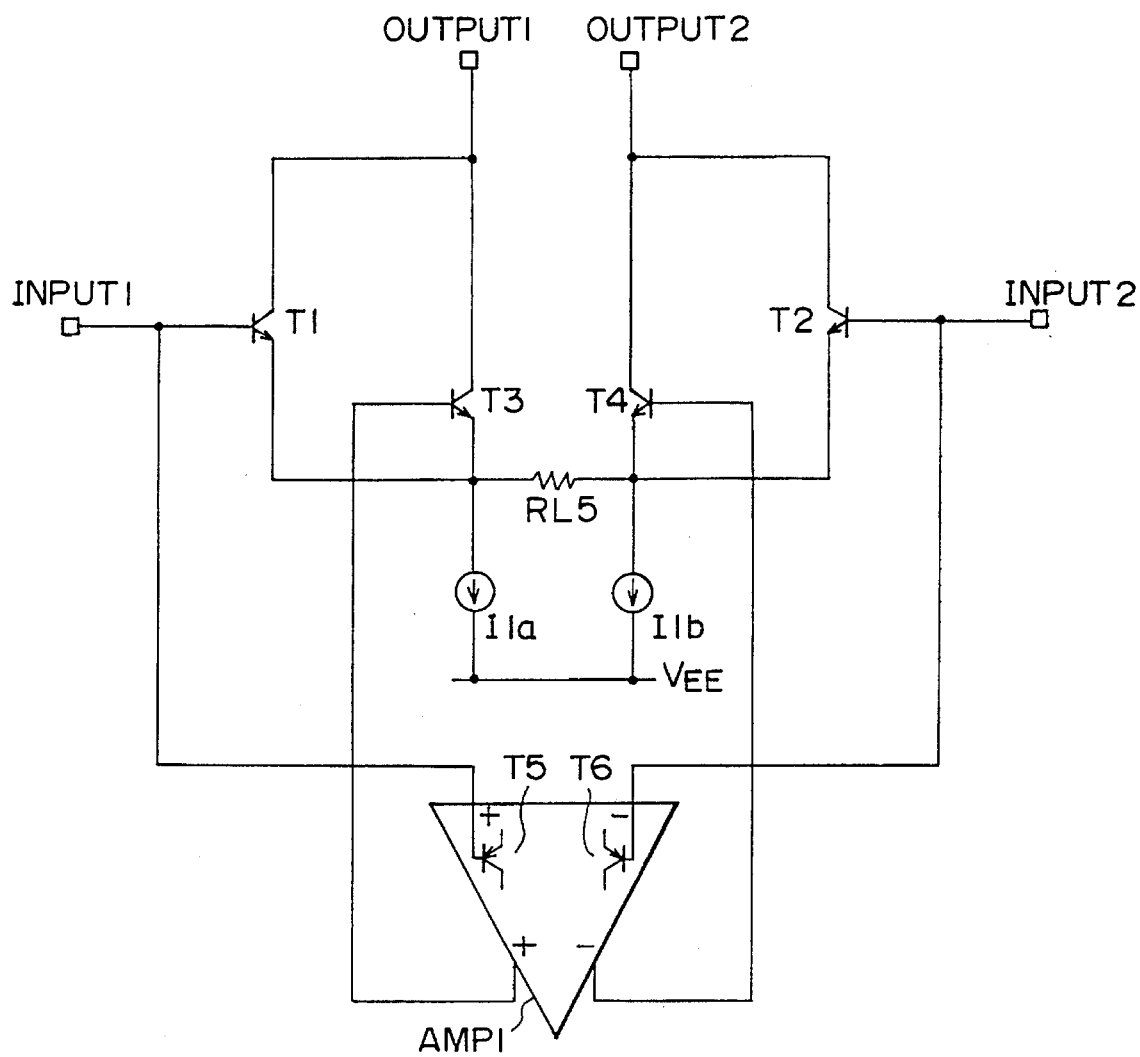
FIG. 4 is a circuit diagram showing a differential put circuit according to a fourth embodiment of the present invention.

In a fourth embodiment shown in FIG. 4, a current source may be divided into current sources $I_{1a}$ and $I_{1b}$ and a resistor RL5 as the emitter degeneration resistor may be inserted into the sources $I_{1a}$ and $I_{1b}$ for commonly using the emitter degeneration resistor to the first and second differential pairs. Since the resistor RL5 may cause the differential pair of the transistors T1 and T2 and the pair of the transistors T3 and T4 not to be sharply changed over, a change of a common mode potential becomes gentle at an input conversion off set occurring by the difference of the operation modes, thereby improving a common mode rejection ratio (CMRR).

Figure 5:
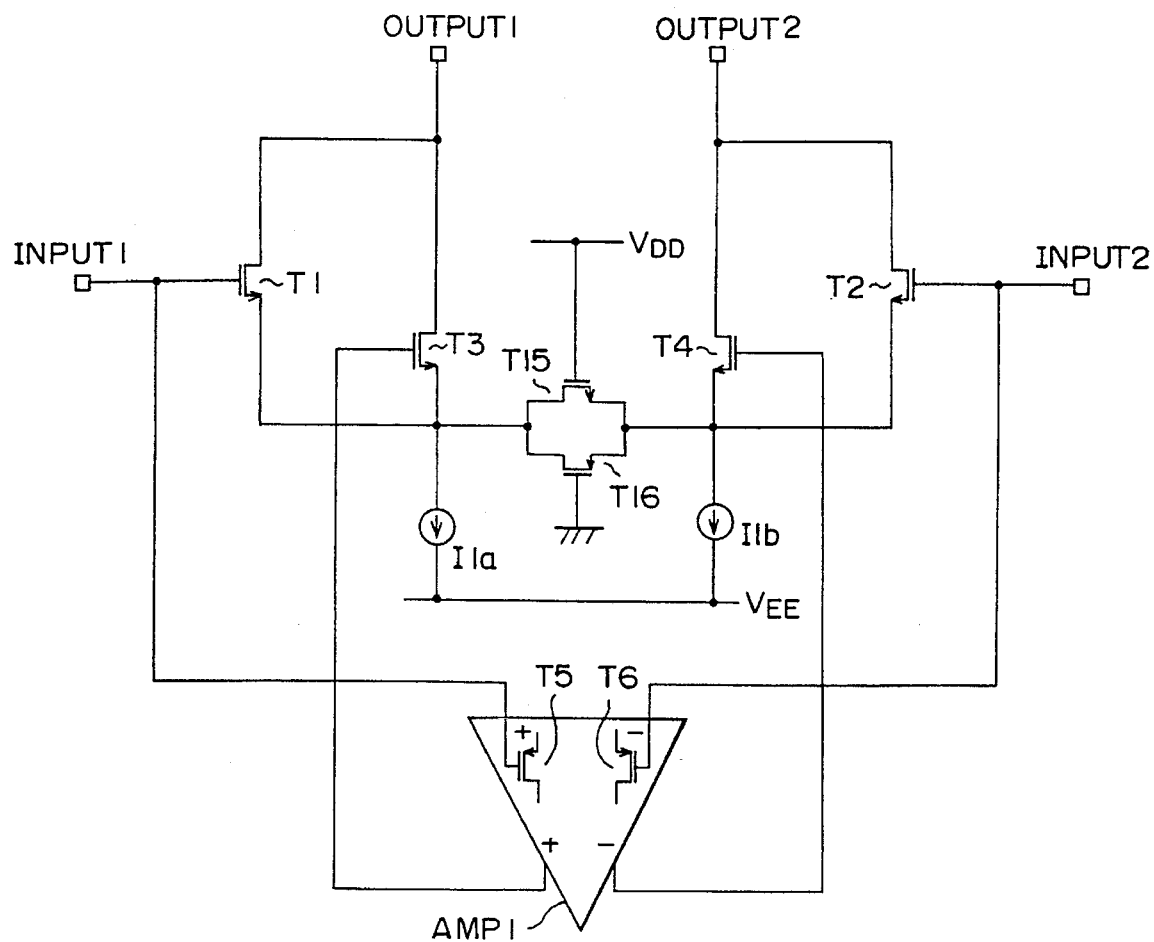
FIG. 5 is a circuit diagram showing a differential input circuit according to a fifth embodiment of the present invention.

In the differential input circuit according to the third and fourth embodiments shown in FIGS. 3 and 4, since each of the circuit elements is formed by the bipolar transistor, the resistors RL1–RL5 have been provided for the emitter degeneration. When each of the circuit elements is formed by the MOS FET, it is unnecessary to provide the resistors for the emitter degeneration. However, even though the element may be constructed from the MOS FET, it is effective to broaden the linear input range. Therefore, in a fifth embodiment shown in FIG. 5, transistors T15 and T16 may be provided by the MOS FET at the position of the emitter degeneration resistor RL5 shown in FIG. 4. Of course, other transistors T1 through T6 have been constituted from the MOS FET.

Next, there will be described a differential input circuit according to a sixth embodiment in which the differential amplifier circuit AMP1 is concretely shown and each of the circuit elements is constituted from the MOS FET in accordance with FIG. 6.

In FIG. 6, a current source $I_1$ is connected to a power source $V_{EE}$ and has an output terminal which is connected to a common source of a first differential pair including N-channel transistors T1 and T2 and a common source of a second differential pair including two N-channel transistors T3 and T4. Differential outputs of the first and second differential pairs are interconnected. Accordingly, drains of the N-channel transistors T1 and T3 are commonly connected, and drains of the n-channel transistors T2 and T4 are also commonly connected.

The differential input signal is supplied to gates of the transistors T1 and T2 as an input portion of the first differential pair, and at the same time, to gates of the P-channel transistors T5 and T6 constituting an input portion of the differential amplifier circuit AMP1. Drains of the transistors T5 and T6 as an output portion of the differential amplifier circuit AMP1 are connected to gates of the N-channel transistors constituting the second differential pair.

Figure 7:
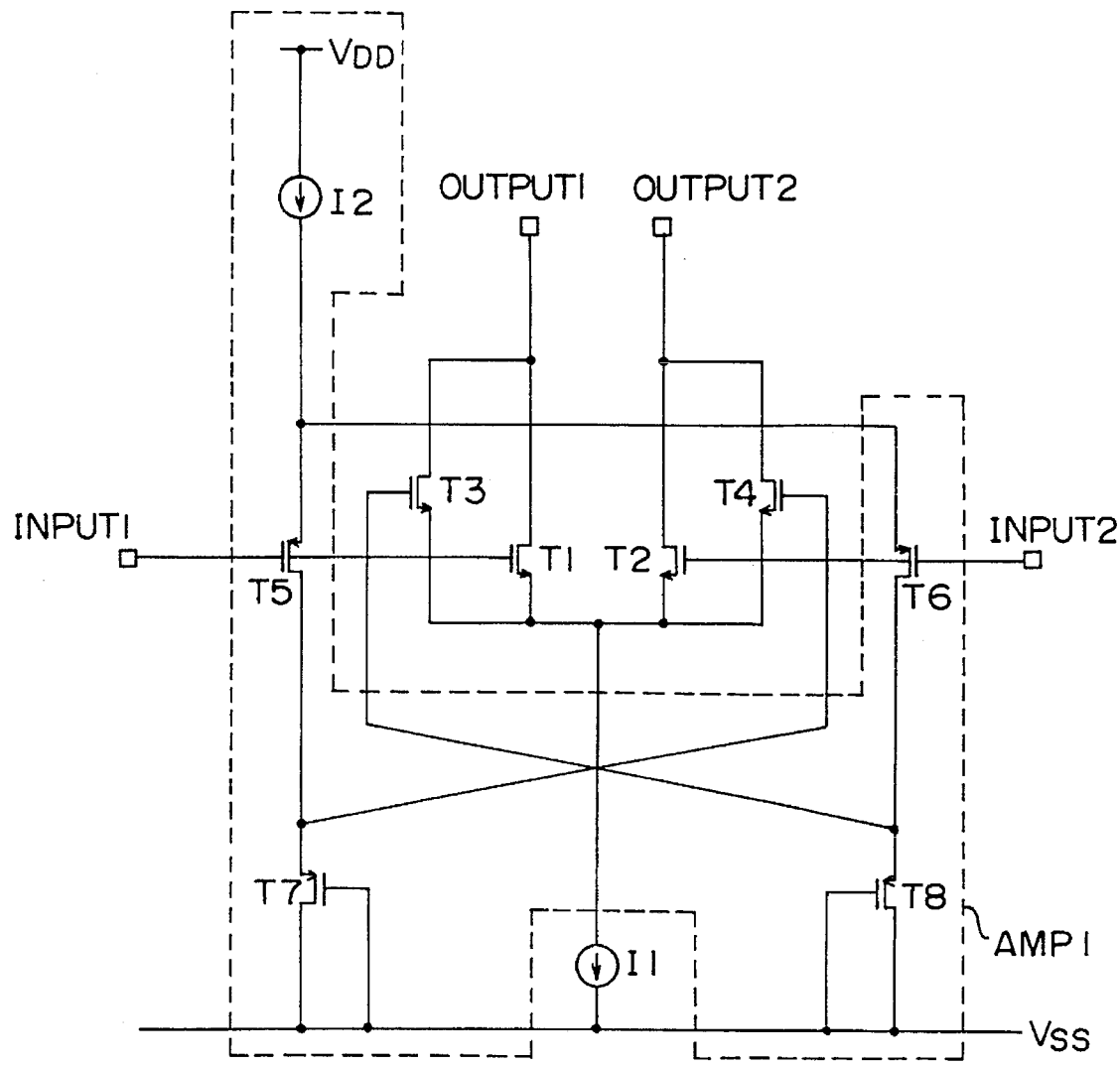
FIG. 7 is a circuit diagram showing a differential input circuit according to a seventh embodiment of the present invention.

Furthermore, as shown in FIG. 7 showing a differential input circuit according to a seventh embodiment, the differential amplifier circuit AMP1 does not include the resistors as the load, and in the place of the resistors, the circuit may comprise transistors T7 and T8 of a diode connection and having a conductivity type as the same as the transistors T5 and T6 constituting the input portion of the differential amplifier circuit AMP1. The differential input circuit according to the seventh embodiment has a plurality of transistor elements which are formed from a MOS FET.

Next, the differential input circuit of the present invention may comprise transistors T7 and T8 by the diode connection, which have a conductivity type opposite to the transistors T5 and T6 constituting an input portion of the differential amplifier circuit in an eighth embodiment shown in FIG. 8.

In the differential input circuit according to the seventh and eighth embodiments, the first load is comprised of the seventh MOS FET T7 which is inserted by a diode connection between the drain of the fifth MOS FET T5 and the first power line $V_{EE}$, and the second load is comprised of the eighth MOS FET T8 which is inserted by a diode connection between the drain of the sixth MOS FET T6 and the first power line $V_{EE}$.

When a ratio of width to length (W/L) of the channel of the transistors T7 and T8 is shortened for increasing an output operating point of the differential amplifier circuit AMP1, the conductance (gm) in the transistors T7 and T8 decreases to increase the gain of the differential amplifier circuit AMP1, so that the conductance (gm) of the differential input circuit largely fails by the common mode input voltage. In order to prevent this failure, a level shift means LS1 is inserted between the power source $V_{SS}$ and the transistors T7 and T8 which are in the diode connection in a ninth embodiment as shown in FIG. 9, thereby setting the ratio of width to length (W/L) of the channel of the transistors T7 and T8 to be large.

In the differential input circuit according to the ninth embodiment, the seventh MOS FET T7 is inserted by a diode connection as the first load for generating a differential voltage between a drain of the fifth MOS FET T5 and the first power line $V_{EE}$, the eighth MOS FET T8 is inserted by a diode connection as the second load for generating a differential voltage between a drain of the sixth MOS FET T6 and the first power line $V_{EE}$, and a level shift means LS1 is provided between the first power line $V_{SS}$ and a common drain of the seventh and eighth MOS FETs T7 and T8 for shifting an output of the differential amplifier circuit to make an output operating point of the differential amplifier circuit including the third differential pair be optimum.

Figure 10:
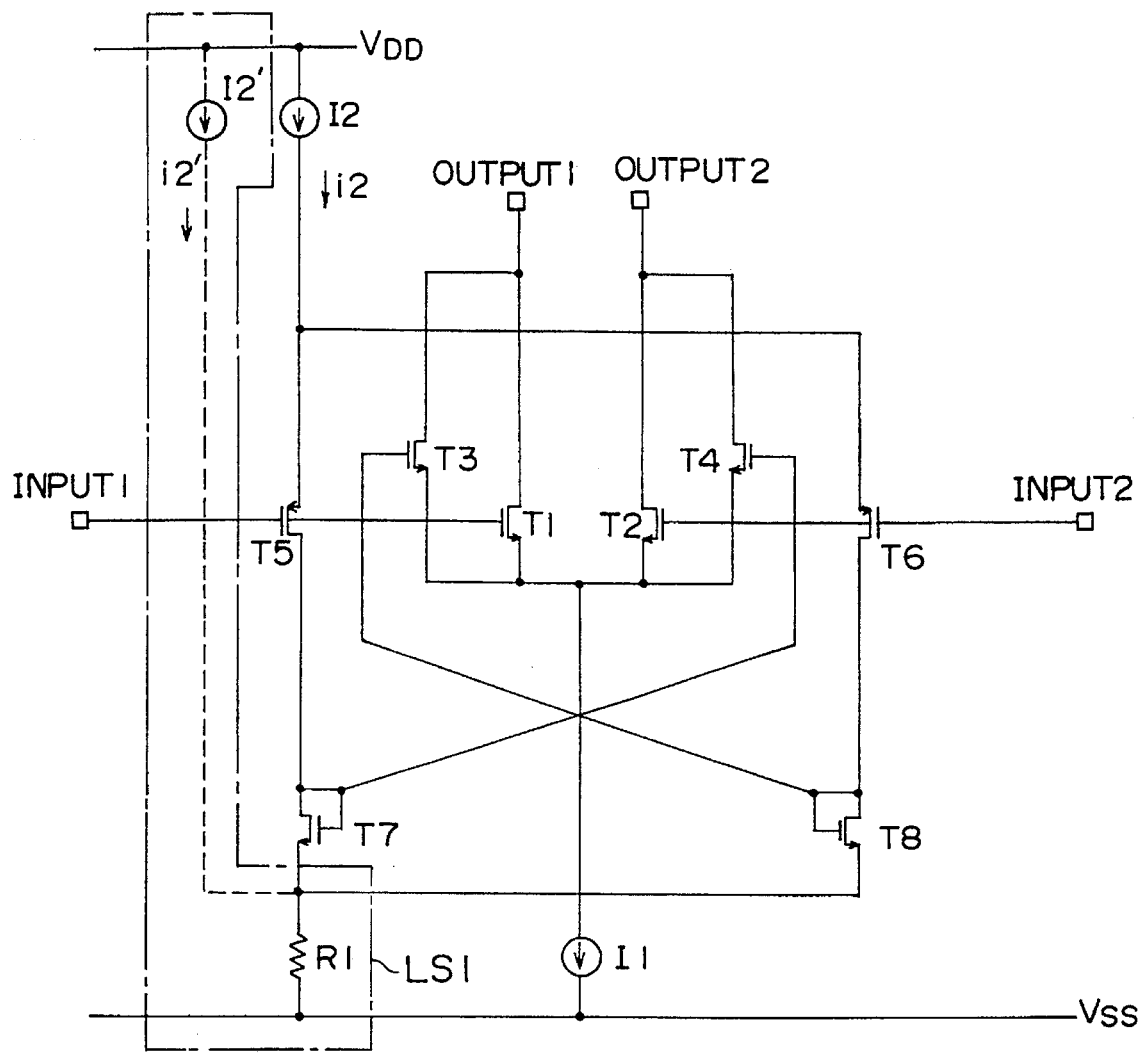
FIG. 10 is a circuit diagram showing a differential input circuit according to a tenth embodiment of the present invention.

FIG. 10 is a differential input circuit according to a tenth embodiment having a detailed constitution of the level shift means. In FIG. 10, the level shift means LS1 is comprised of a resistor R1 and has a level shift voltage represented by "$i_2 \cdot R1$". Furthermore, a current source $I_2'$ may be connected to the resistor R2 to regulate the level shift voltage, as shown by the dotted line shown in FIG. 10.

In the differential input circuit according to the tenth embodiment, the level shift means LS1 is comprised of a resistor R1 which is inserted between the first power line $V_{SS}$ and the common drain of the seventh and eighth MOS FETs T7 and T8.

Figure 11:
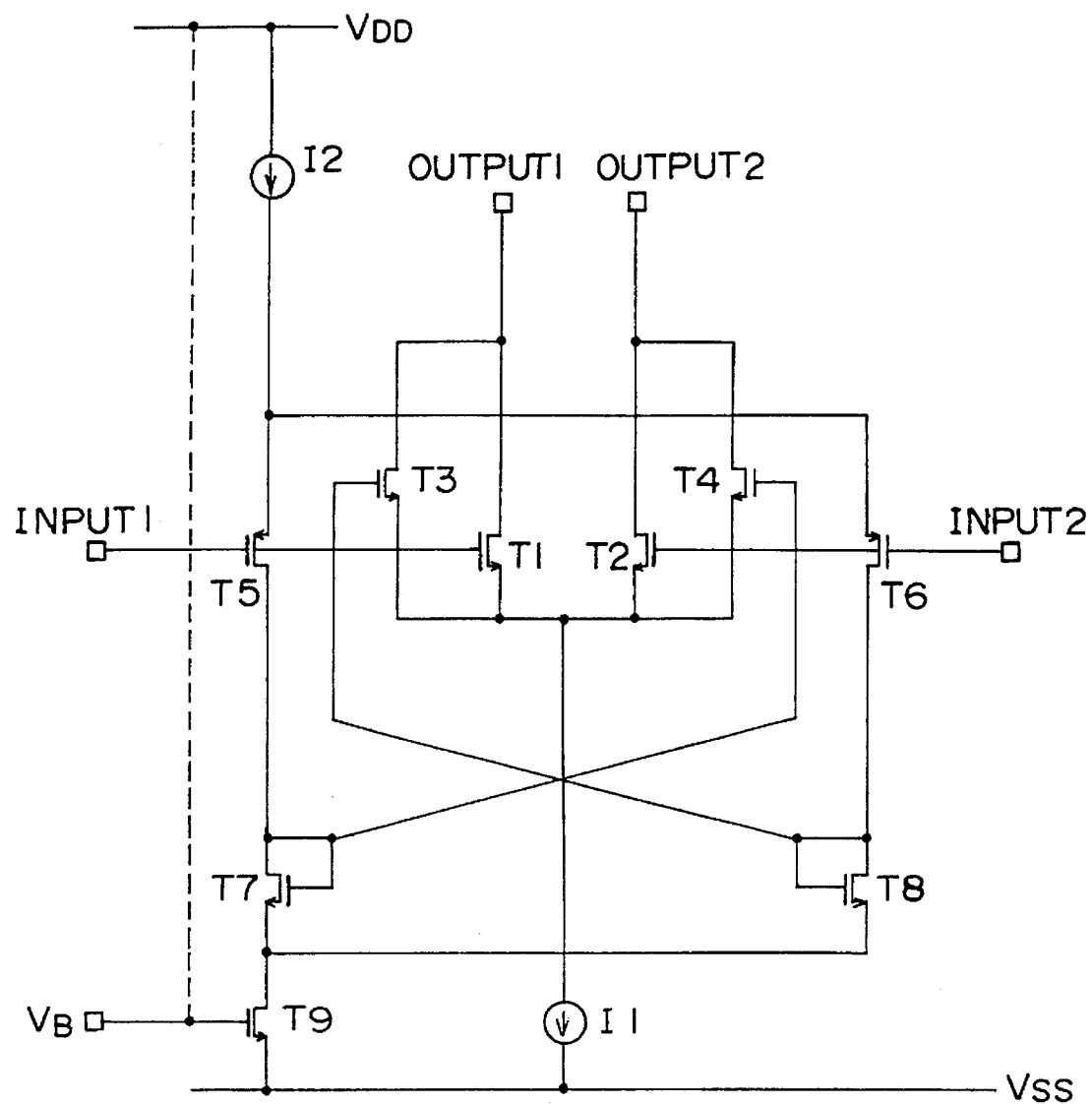
FIG. 11 is a circuit diagram showing a differential input circuit according to an eleventh embodiment of the present invention.

Furthermore, as shown in FIG. 11 of an eleventh embodiment, the resistor R1 can be realized by a transistor T9 as an ON resistor. At this time, a resistance value is determined by a bias voltage $V_b$ which is supplied to a gate of the transistor T9. The simplest determination method is to use a power source $V_{DD}$ as shown by a dotted line in FIG. 11.

In the differential input circuit according to the eleventh embodiment, the level shift means LS1 is comprised of the ninth MOS FET T9 inserted between the first power line $V_{SS}$ and the common drain of the seventh and eighth MOS FETs T7 and T8, and has a gate to which a bias voltage is supplied.

Moreover, in the differential input circuit according to the eleventh embodiment, the bias voltage is supplied from the second power line $V_{DD}$ to the gate of the ninth MOS FET T9 as the level shift means LS1.

Furthermore, in the manner of a twelfth and a thirteenth embodiments as shown in FIGS. 12 and 13, transistors T10 and T11 are connected in parallel with each other as ON resistor in which a resistance value is determined by each of differential output potentials in the differential amplifier circuit AMP1.

In the differential input circuit according to the thirteenth embodiment, the level shift means LS1 is comprised of the tenth and eleventh MOS FETs T10 and T11 respectively having gates which are driven by drain voltages of the fifth and sixth MOS FETs T5 and T6 constituting the third differential pair, respectively.

In the sixth embodiment, even though the differential input circuit has elements constructed from the MOS FET, the elements may be constructed from the bipolar transistors in the manner of a fourteenth embodiment shown in FIG. 14.

FIG. 14 shows the fourteenth embodiment as the detailed example of the differential amplifier circuit.

In FIG. 14, a power source $V_{SS}$ is connected to a current source $I_1$ having an output terminal which is connected to common emitters of the first differential pair constructed by npn transistors T1 and T2 and to common emitters of the second differential pair constructed by npn transistors T3 and T4. Differential outputs of the first and second differential pairs are respectively interconnected with each other. Accordingly, collectors of the npn transistors T1 and T3 are commonly connected with each other, and collectors of the npn transistors T2 and T4 are also commonly connected with each other. A differential input signal is supplied to the bases of the npn transistors T1 and T2 as the input portion of the first differential pair, and at the same time, to the bases of the npn transistors T5 and T6 constituting the input portion of the differential amplifier circuit AMP1. Collectors of the npn transistors T5 and T6 as the differential output of the differential amplifier circuit AMP1 are connected to the bases of the npn transistors T3 and T4 constituting the second differential pair. Here, the differential amplifier circuit AMP1 is comprised of the transistors T5 and T6, loads L1 through L4, and a current source $I_2$. A current $i_2$ supplied from the current source $I_2$ and the loads L1 and L2 are respectively selected to satisfy the following condition, namely, $i_2 \times L1/2 = i_2 \times L2/2 \geq$ "a base-emitter voltage in the regular direction of the bipolar transistor: substantially 0.7 V".

According to such a constitution, when the common mode potential $V_c$ of the differential input signal is more than the base-emitter voltage in the regular direction of the npn transistors and the pnp transistors T5 and T6 in the differential amplifier circuit AMP1 are turned off, a current from the current source $I_2$ does not flow in the loads L1 and L2, a potential of the collectors of the pnp transistors T5 and T6 as a differential output of the differential amplifier circuit AMP1 is equal to the power source voltage $V_{EE}$, and the npn transistors T3 and T4 in the second differential pair are turned off, thereby causing the second differential pair including the npn transistors T3 and T4 to operate as the differential input circuit.

Furthermore, when the common mode potential $V_c$ of the differential input signal is more than the base-emitter voltage in the regular direction of the npn transistor and within the potential range capable of operating the pnp transistors T5 and T6, the operating point of the output of the differential amplifier circuit AMP1 is selected to be over the base-emitter voltage in the regular direction of the npn transistors T3 and T4, thereby causing any of the first and second differential pairs to operate as the differential input circuit.

Still furthermore, when the common mode potential $V_c$ of the differential input signal is less than the base-emitter voltage in the regular direction of the npn transistor, the npn transistors T3 and T4 are turned off, an input of the differential amplifier circuit AMP1 for receiving the input signal operates without turning off because of the construction of the pnp transistor, and the operating point of the output of the differential amplifier circuit AMP1 is selected to be over the base-emitter voltage in the regular direction of the npn transistors T3 and T4, thereby operating the first differential pair including the npn transistors T1 and T2 as the differential input circuit.

As described above, the sum of the differential current of the differential input circuit according to the fourteenth embodiment of the present invention is constant and even in spite of the common mode potential $V_c$ of the differential input signal, because at least any of the first and second differential pairs operates as the differential input circuit, the emitter terminals are commonly connected to receive the current in the second differential pair, and the differential outputs are commonly connected between the first and second differential pairs.

FIG. 15 is a circuit diagram showing the differential input circuit according to the fifteenth embodiment as a further detailed configuration of the circuit according to the fifteenth embodiment. In FIG. 15, resistors R10 through R13 are provided as a detailed example of the loads L1 through L4 in FIG. 7, respectively. Accordingly, the relationship between the resistors R10 through R13 is set under the condition that there is "$i_2 \cdot R10/2 = i_2 \cdot R11/2$" which is over the base-emitter voltage being substantially 0.7 V.

In the differential input circuit according to the fifteenth embodiment, the first load includes at least the resistor T10 which is provided between the collector of the fifth bipolar transistor T5 and the first power line $V_{EE}$, and the second load includes at least the resistor R11 which is provided between the collector of the sixth bipolar transistor T6 and the first power line $V_{EE}$.

There is a differential input circuit according to a sixteenth embodiment in which bipolar transistors are provided for the elements of the MOS FET in the differential input circuit according to the seventh embodiment shown in FIG. 7. Transistors T1 through T8 are constituted from bipolar transistors.

Even though the differential input circuit according to the seventh through eleventh embodiments comprises the circuit element formed from the MOS FET, each of the transistors in the circuitry may be comprised of the bipolar transistors.

Figure 17:
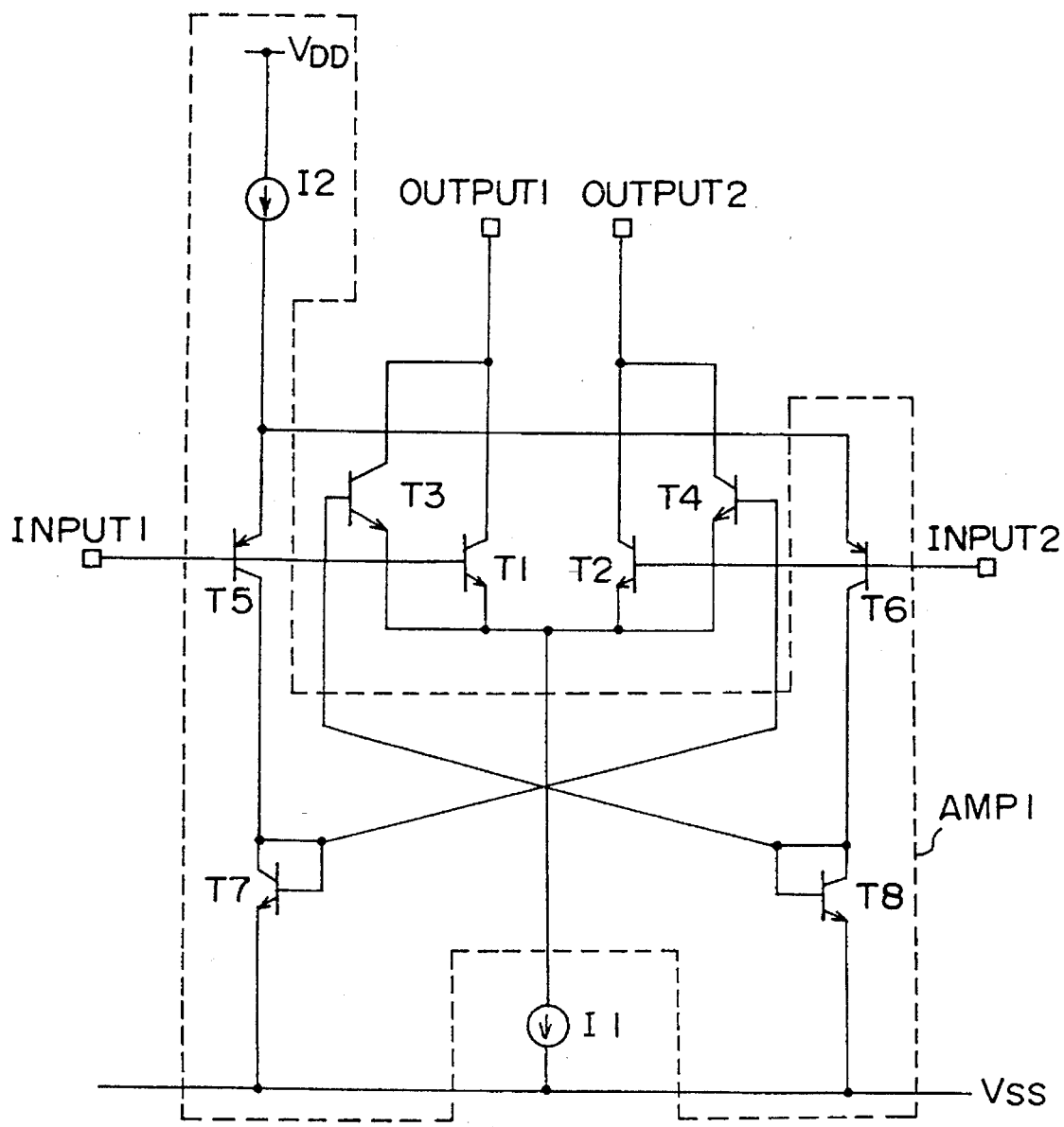
FIG. 17 is a circuit diagram showing a differential input circuit according to a seventeenth embodiment of the present invention.

FIG. 17 shows a differential input circuit according to a seventeenth embodiment. In FIG. 17, the differential amplifier circuit AMP1 comprises npn type transistors T5 and T6, and pnp type transistors T7 and T8 which are connected in the diode connection and different conductive type to the transistors T5 and T6.

In the differential input circuit according to the sixteenth and seventeenth embodiments, the first load is comprised of the seventh bipolar transistor T7 which is inserted by a diode connection for generating a differential voltage between the collector of the fifth bipolar transistor T5 and the first power line $V_{SS}$, and the second load is comprised of the eighth bipolar transistor T8 which is inserted by a diode connection for generating a differential voltage between the collector of the sixth bipolar transistor T6 and the first power line $V_{EE}$.

FIG. 18 shows a differential input circuit according to an eighteenth embodiment corresponding to the ninth embodiment of the present invention shown in FIG. 9. In FIG. 18, a level shift means LS1 is inserted between the power source $V_{SS}$ and the transistors T7 and T8, thereby increasing a width to length ratio of the channel of the transistors T7 and T8.

In the differential input circuit according to the sixteenth embodiment, a collector of the fifth bipolar transistor T5 constituting the third differential pair is connected to the first power line $V_{SS}$ through the bipolar transistor T7 as the first load for generating a differential voltage, a collector of the sixth bipolar transistor constituting the third differential pair is connected to the first power line $V_{SS}$ through the eighth bipolar transistor T8 as the second load for generating a differential voltage, and the level shift means LS1 is provided between the first power line $V_{SS}$ and the transistors T7 and T8 as the first and second loads for shifting an output of the differential amplifier circuit including the third differential pair in the manner of setting an output operating point of the differential amplifier circuit to be optimum.

Figure 19:
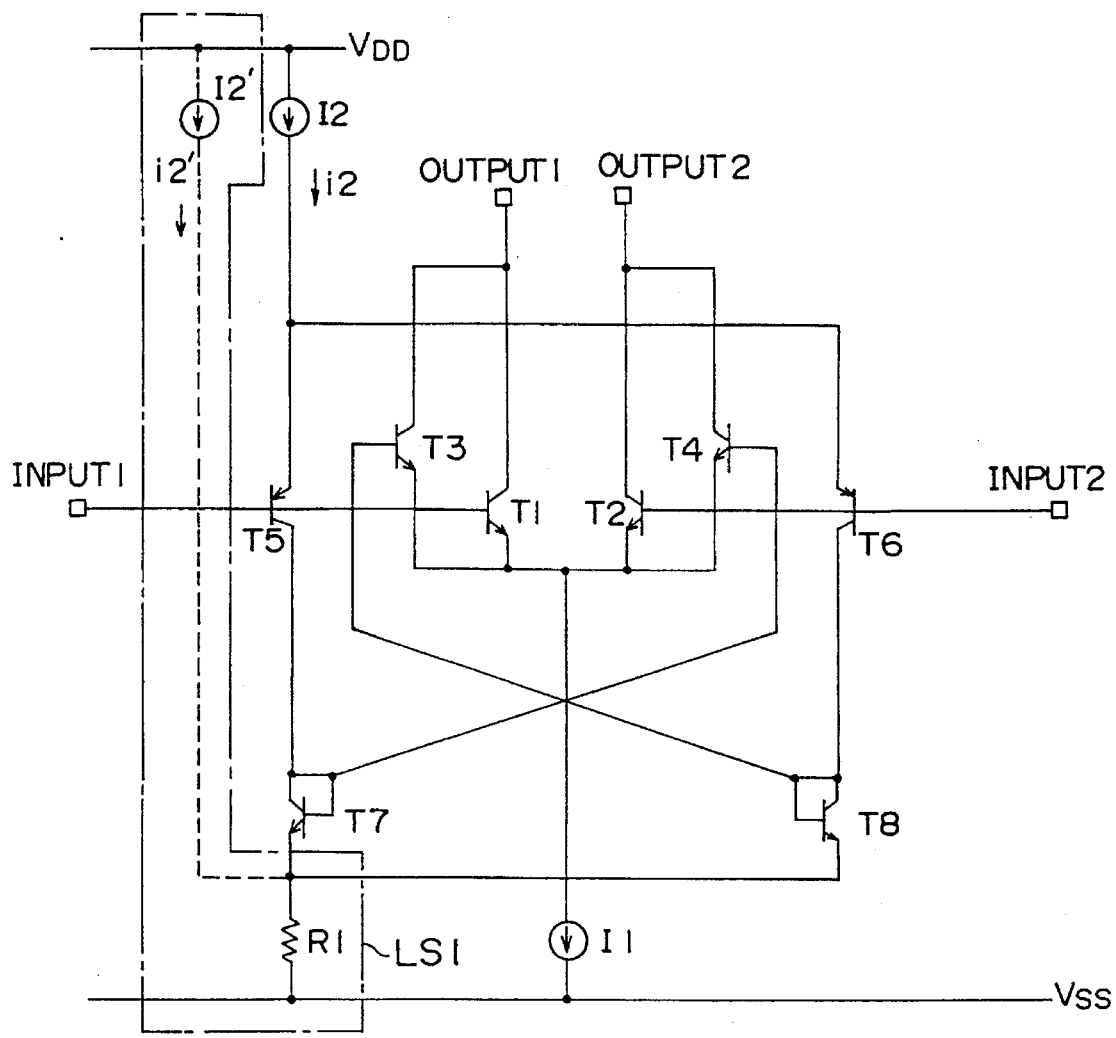
FIG. 19 is a circuit diagram showing a differential input circuit according to a nineteenth embodiment of the present invention.

FIG. 19 shows a differential input circuit according to a nineteenth embodiment corresponding to the tenth embodiment. In FIG. 19, the level shift means LS1 is comprised of a resistor R1 and a level shift voltage can be represented by "$i_2 \cdot R1$". In the same manner as the thirteenth embodiment, the current source $i_2'$ in the seventeenth embodiment may be connected to the resistor R1 so as to regulate the level shift voltage.

Accordingly, in the differential input circuit according to the nineteenth embodiment, the level shift means LS1 is comprised of the resistor R1 which is inserted between the first power line $V_{SS}$ and the transistors T7 and T8 as the first and second loads.

Furthermore, in the differential input circuit according to nineteenth embodiment, the first load is comprised of the seventh bipolar transistor T7 which is inserted by a diode connection between the first power line $V_{SS}$ and the collector of the fifth bipolar transistor T5 constituting the third differential pair, the second load is comprised of the eighth bipolar transistor which is inserted by a diode connection between the first power line $V_{SS}$ and the collector of the sixth bipolar transistor T6, and the second power line $V_{DD}$ is connected through a second current source I2' to a junction point between the resistor R1 as the level shift means and the common collector of the seventh and eighth bipolar transistor T7 and T8 as the first and second loads.

Figure 20:
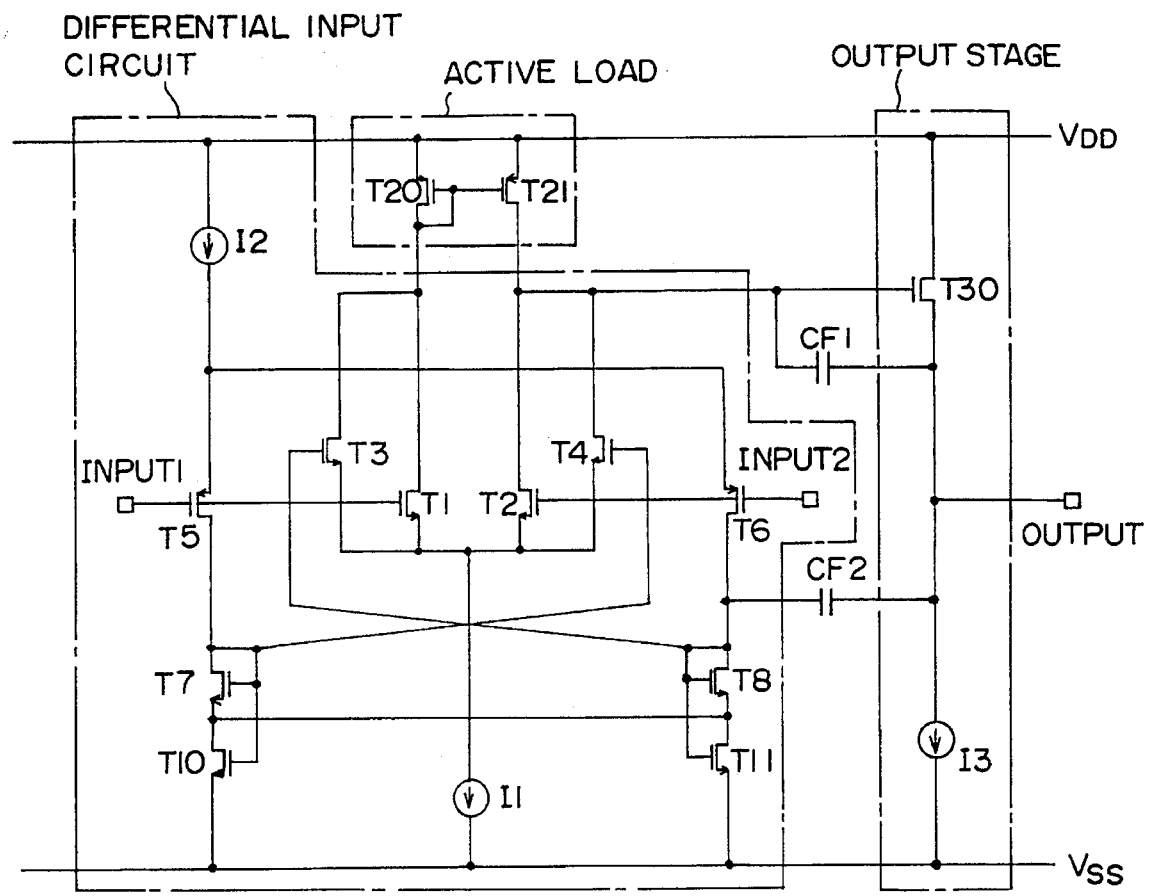
FIG. 20 is a circuit diagram showing a differential input circuit according to a twentieth embodiment of the present invention.

FIG. 20 shows a differential input circuit according to a twentieth embodiment in which the differential input circuit of the nineteenth embodiment is applied to an operation amplifier having a two stage constitution.

In FIG. 20, an initial stage in the operation amplifier is constituted by the differential input circuit shown in FIG. 13 and an active load of the current mirror circuit type including the transistors T20 and T21, and an output stage of an inverting amplifier type in the operation amplifier is constituted by a transistor T30 and a current source I3. Capacitors CF1 and CF2 are provided for compensating a phase. As described above, since the differential input circuit operates without depending on a common mode potential of the differential input signal, the initial stage of the differential amplifier circuit also operates without depending on the common mode potential of the differential input signal. Furthermore, an operating point of the transistor T30 constituting an input portion of the output stage is substantially a voltage $V_{dd}$– which is a threshold voltage of the P-channel transistor, without depending on the common mode potential of the threshold input signal, and the output stage ordinarily operates. In this manner, when the differential input circuit of the present invention is applied to the operation amplifier circuit, it is possible to obtain the operation amplifier circuit capable of operating without the common mode potential of the differential input signal.

In the differential input circuit according to twentieth embodiment, the differential input circuit is arranged as an input stage in an operation amplifier. The operation amplifier comprises the differential input circuit as the input stage for receiving differential inputs; an active load receiving a differential output current of the differential input circuit for generating a voltage corresponding to the current; an output stage receiving the voltage generated in the active load for outputting a final output; and a capacitor provided between the final output of the output stage and an output of the differential input circuit and/or the active load for compensating the phase of the final output.

Figure 21:
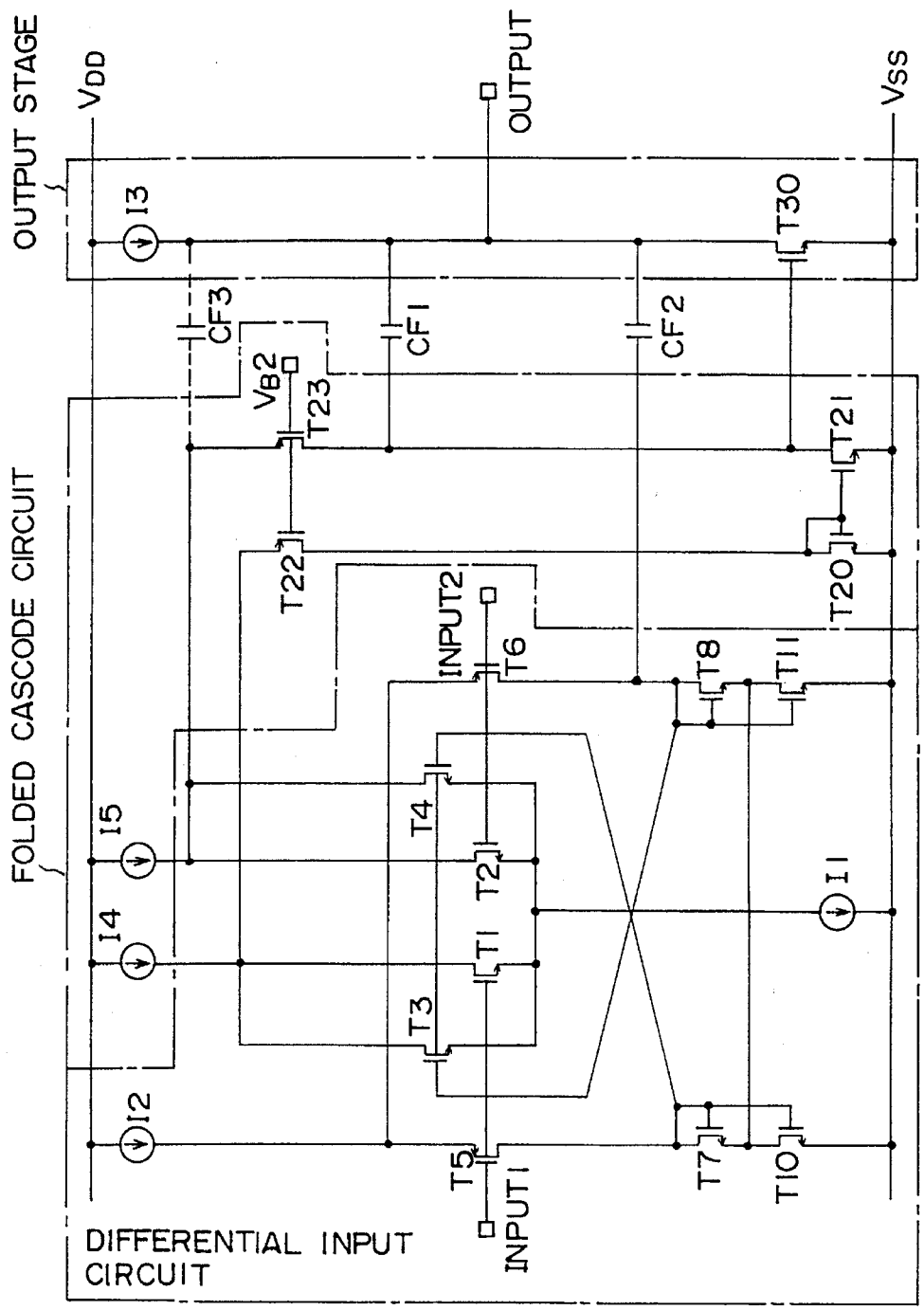
FIG. 21 is a circuit diagram showing a differential input circuit according to a twenty-first embodiment of the present invention.

FIG. 21 shows a differential input circuit according to a twenty-first embodiment of the present invention of which the differential input circuit according to the thirteenth embodiment is applied to an operating amplifier which has a two stage constitution in which an output portion of the initial stage is formed by a folded cascade circuit, thereby obtaining the operation amplifier capable of operating without depending on the common mode potential of the differential input signal in the same manner of the operation amplifier circuit shown in FIG. 20.

Figure 23:
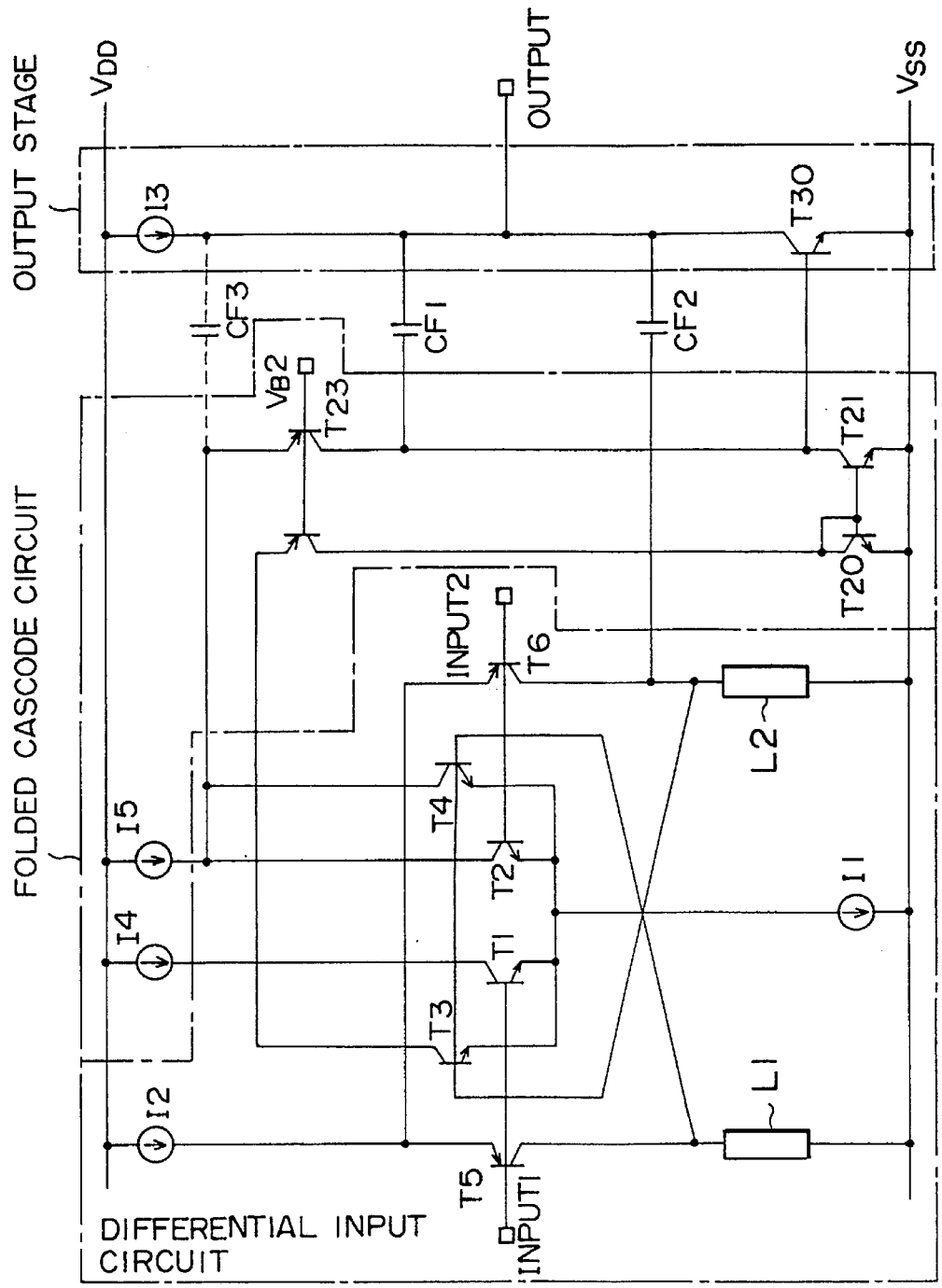
FIG. 23 is a circuit diagram showing a differential input circuit according to a twenty-third embodiment of the present invention.

Furthermore, FIGS. 22 and 23 show operation amplifiers according to twenty-second and twenty-third embodiments of the present invention.

In the differential input circuit according to the twenty-second embodiment, the differential input circuit is arranged as an input stage in an operation amplifier. The operation amplifier comprises the differential input circuit as the input stage for receiving differential inputs; an active load receiving a differential output current of the differential input circuit for generating a voltage corresponding to the current;

an output stage receiving the voltage generated in the active load for outputting a final output; and a capacitor provided between the final output of the output stage and an output of the differential input circuit and/or the active load for compensating a phase of the final output.

The operation amplifier according to the twenty-second embodiment of the present invention corresponds to the operation amplifier according to the twenty-first embodiment. In FIGS. 22 and 23, the differential input circuits have the same circuitry in the fourteenth embodiment shown in FIG. 14, respectively.

What is claimed is:

1. A differential input circuit, comprising a first differential pair including first and second transistors having the same conductivity type and formed of a semiconductor of one of a first conductivity type in which a conduction electron density is larger than a hole density and a second conductivity type in which the hole density is larger than the conduction electron density, for receiving a differential input signal, and for transmitting a differential output signal;

a second differential pair including third and fourth transistors constructed from a semiconductor of the same conductivity type as said first and second transistors constituting said first differential pair, and which is commonly connected to an output of said first differential pair;

input means for supplying a differential signal to said first differential pair;

output means for adding differential signals respectively supplied from said first and second differential pairs so as to output an added differential signal; and a differential amplifier circuit at least comprising a third differential pair including fifth and sixth transistors which are formed by a semiconductor of the second conductivity type different from said first conductivity type forming said first through fourth transistors constituting said first and second differential pair and having a common bias current source; for inputting said differential input signal commonly with the first differential pair; and for generating a differential amplified signal which is supplied to said second differential pair; so that a potential of an output operating point is set to operate said third and fourth transistors of said second differential pair;

wherein, when a common mode input range of said differential input signal is outside a circuit operating range of said differential amplifier circuit, an output potential of said differential amplifier circuit causes said second differential pair to stop operating.

2. The differential input circuit according to claim 1; wherein said first through fourth transistors are formed of one of an N-channel metal oxide semiconductor field effect transistor (MOS FET) and a P-channel MOS FET;

said fifth and sixth transistors are formed of the other type of MOS FET of said first through fourth MOS FET;

a first differential input signal is supplied to gates of said first MOS FET and said fifth MOS FET, a second differential input signal is supplied to gates of said second MOS FET and said sixth MOS FET, a drain output of said sixth MOS FET is supplied to a gate of said third MOS FET, and a drain output of said fifth MOS FET is supplied to a gate of said fourth MOS FET;

sources of said first through fourth NMOS FET are commonly connected with one another and to a first power line through a first current source as a bias means; and sources of said fifth and sixth PMOS FET are commonly connected with each other and to a second power line through a second current source.

3. The differential input circuit according to claim 2; wherein a drain of said fifth MOS FET constituting said third differential pair is connected to said first power line through a first load for generating a first voltage; and a drain of said sixth MOS FET constituting said third differential pair is connected to said first power line through a second load for generating a second voltage, wherein a differential voltage is obtained by a difference between said first and second voltages.

4. The differential input circuit according to claim 3; wherein said first load is comprised of a seventh MOS FET which is inserted by a diode connection between said drain of said fifth MOS FET and said first power line; and said second load is comprised of an eighth MOS FET which is inserted by a diode connection between said drain of said sixth MOS FET and said first power line.

5. The differential input circuit according to claim 3; wherein a seventh MOS FET is inserted by a diode connection as a first load for generating said first voltage between a drain of said fifth MOS FET and said first power line;

an eighth MOS FET is inserted by a diode connection as a second load for generating said second voltage between a drain of said sixth MOS FET and said first power line; and a level shift means is provided between said first power line and a common node of said seventh and eighth MOS FET for shifting an output of said differential amplifier circuit to make an output operating point of said differential amplifier circuit including said third differential pair be optimum.

6. The differential input circuit according to claim 5; wherein said level shift means is comprised of a tenth and eleventh MOS FET respectively having gates which are driven by drain voltages of said fifth and sixth MOS FET constituting said third differential pair, respectively.

7. The differential input circuit according to claim 5; wherein said level shift means is comprised of a resistor which is inserted between said first power line and said common node of said seventh and eighth MOS FET.

8. The differential input circuit according to claim 7; wherein said second power line is connected through a third current source to a junction point between said resistor as said level shift means and said common node of said seventh and eighth MOS FET as said first and second loads.

9. The differential input circuit according to claim 5; wherein said level shift means is comprised of a ninth MOS FET inserted between said first power line and said common node of said seventh and eighth MOS FET, and has a gate to which a bias voltage is supplied.

10. The differential input circuit according to claim 9; wherein said bias voltage is supplied from said second power line to said gate of said ninth MOS FET as said level shift means.

11. The differential input circuit according to claim 2; wherein said differential input circuit is arranged as an input stage in an operation amplifier comprising said differential input circuit as said input stage for receiving differential inputs;

an active load receiving a differential output current of said differential input circuit for generating a voltage corresponding to said current;

an output stage receiving said voltage generated in said active load for outputting a final output; and a capacitor provided between said final output of said output stage and an output of said differential input circuit and said active load for compensating a phase of said final output.

12. The differential input circuit according to claim 1, wherein said first through fourth transistors are formed of one of an npn-type bipolar transistor and a pnp-type bipolar transistor;

said fifth and sixth transistors are formed of the other bipolar transistor of said first through fourth bipolar transistors;

a first differential input signal is supplied to bases of said first bipolar transistor and said fifth bipolar transistor, a second differential input signal is supplied to bases of said second bipolar transistor and said sixth bipolar transistor, a collector output of said sixth bipolar transistor is supplied to a base of said third bipolar transistor, and a collector output of said fifth bipolar transistor is supplied to a base of said fourth bipolar transistor;

emitters of said first through fourth bipolar transistors are commonly connected with one another and to a first power line through a first current source as said bias means; and emitters of said fifth and sixth bipolar transistors are commonly connected with each other and to a second power line through a second current source.

13. The differential input circuit according to claim 12; wherein a collector of said fifth bipolar transistor constituting said third differential pair is connected to said first power line through a first load for generating a third voltage; and a collector of said sixth bipolar transistor constituting said third differential pair is connected to said first power line through a second load for generating a fourth voltage, wherein a differential voltage is obtained by a difference between said third and fourth voltages.

14. The differential input circuit according to claim 13; wherein said first load includes at least a resistor which is provided between said collector of said fifth bipolar transistor and said first power line; and said second load includes at least a resistor which is provided between said collector of said sixth bipolar transistor and said first power line.

15. The differential input circuit according to claim 13; wherein said first load is comprised of a seventh bipolar transistor which is inserted by a diode connection for generating said third voltage between said collector of said fifth bipolar transistor and said first power line; and said second load is comprised of an eighth bipolar transistor which is inserted by a diode connection for generating said fourth voltage between said collector of said sixth bipolar transistor and said first power line.

16. The differential input circuit according to claim 12; wherein a collector of said fifth bipolar transistor constituting said third differential pair is connected to said first power line through a first load for generating a fifth voltage;

a collector of said sixth bipolar transistor constituting said third differential pair is connected to said first power line through a second load for generating a sixth voltage; and a level shift means is provided between said first power line and said first and second loads for shifting an output of said differential amplifier circuit including said third differential pair in the manner of setting an output operating point of said differential amplifier circuit to be optimum, wherein a differential voltage is obtained by a difference between said fifth and sixth voltages.

17. The differential input circuit according to claim 16; wherein said level shift means is comprised of a resistor which is inserted between said first power line and said first and second loads.

18. The differential input circuit according to claim 17; wherein said first load is comprised of a seventh bipolar transistor which is inserted by a diode connection between said first power line and said collector of said fifth bipolar transistor constituting said third differential pair;

said second load is comprised of an eighth bipolar transistor which is inserted by a diode connection between said sixth transistor constituting said third differential pair; and said second power line is connected through a second current source to a junction point between said resistor as said level shift means and a common node of said seventh and eighth bipolar transistor as said first and second loads.

19. The differential input circuit according to claim 12; wherein said differential input circuit is arranged as an input stage in an operation amplifier comprising said differential input circuit as said input stage for receiving differential inputs;

an active load receiving a differential output current of said differential input circuit for generating a voltage corresponding to said current;

an output stage receiving said voltage generated in said active load for outputting a final output; and a capacitor provided between said final output of said output stage and an output of said differential input circuit and said active load for compensating a phase of said final output.

* * * * *